(12) United States Patent
Ota et al.

(10) Patent No.: US 10,367,035 B2
(45) Date of Patent: Jul. 30, 2019

(54) ELECTROOPTICAL DEVICE, ELECTRONIC APPARATUS, AND HEAD MOUNT DISPLAY

(71) Applicant: SEIKO EPSON CORPORATION, Tokyo (JP)

(72) Inventors: Hitoshi Ota, Shiojiri (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/882,264

(22) Filed: Jan. 29, 2018

(65) Prior Publication Data

US 2018/0219050 A1  Aug. 2, 2018

(30) Foreign Application Priority Data

Feb. 1, 2017  (JP) ................. 2017-016529
Nov. 13, 2017  (JP) ................. 2017-218018

(51) Int. Cl.
*H01L 27/32* (2006.01)
*G02B 27/01* (2006.01)
*H01L 51/52* (2006.01)

(52) U.S. Cl.
CPC ...... *H01L 27/3211* (2013.01); *G02B 27/0172* (2013.01); *H01L 27/3218* (2013.01); *H01L 27/3248* (2013.01); *H01L 27/3276* (2013.01); *H01L 51/5203* (2013.01); *G02B 2027/0112* (2013.01); *H01L 27/3213* (2013.01); *H01L 27/3216* (2013.01); *H01L 2251/5315* (2013.01)

(58) Field of Classification Search
CPC ............. H01L 27/3211; H01L 27/3218; H01L 27/3248; H01L 51/5203; H01L 27/3276; H01L 27/3213; H01L 2251/5315; H01L 27/3216; G02B 27/0172; G02B 2027/0112; G09G 2300/0452; G09G 2300/0443; G09G 3/3607; G09G 2300/0465; G09G 3/2074; G09G 2300/0426

See application file for complete search history.

(56) References Cited

U.S. PATENT DOCUMENTS

| 2009/0289963 | A1 | 11/2009 | Minami et al. |
| 2011/0291550 | A1 | 12/2011 | Kim et al. |
| 2014/0361316 | A1* | 12/2014 | Nozawa ............... H01L 51/5265 257/88 |
| 2015/0102323 | A1 | 4/2015 | Koshihara et al. |
| 2015/0194474 | A1* | 7/2015 | Choi .................. H01L 27/3232 349/69 |

(Continued)

FOREIGN PATENT DOCUMENTS

| JP | 2009-282190 A | 12/2009 |
| JP | 2011-249334 A | 12/2011 |

(Continued)

*Primary Examiner* — Premal R Patel
(74) *Attorney, Agent, or Firm* — Oliff PLC

(57) ABSTRACT

An electrooptical device includes a first sub-pixel, a first region, a second sub-pixel, a second region, a third sub-pixel, a third region, a fourth sub-pixel, and a fourth region, which are arranged in an X direction as a first direction. The first sub-pixel and the second sub-pixel have different colors from each other, the third sub-pixel and the fourth sub-pixel have different colors from each other, and the first region, the second region, the third region, and the fourth region have the same length in the X direction.

20 Claims, 16 Drawing Sheets

(56) References Cited

U.S. PATENT DOCUMENTS

2015/0311265 A1    10/2015  Matsueda et al.
2016/0307487 A1*  10/2016  Ikeda .................. G09G 3/2003
2018/0090546 A1*   3/2018  Hashimoto ......... H01L 27/3211

FOREIGN PATENT DOCUMENTS

JP         2015-076300 A    4/2015
JP         2015-206988 A   11/2015

* cited by examiner

FIG. 1
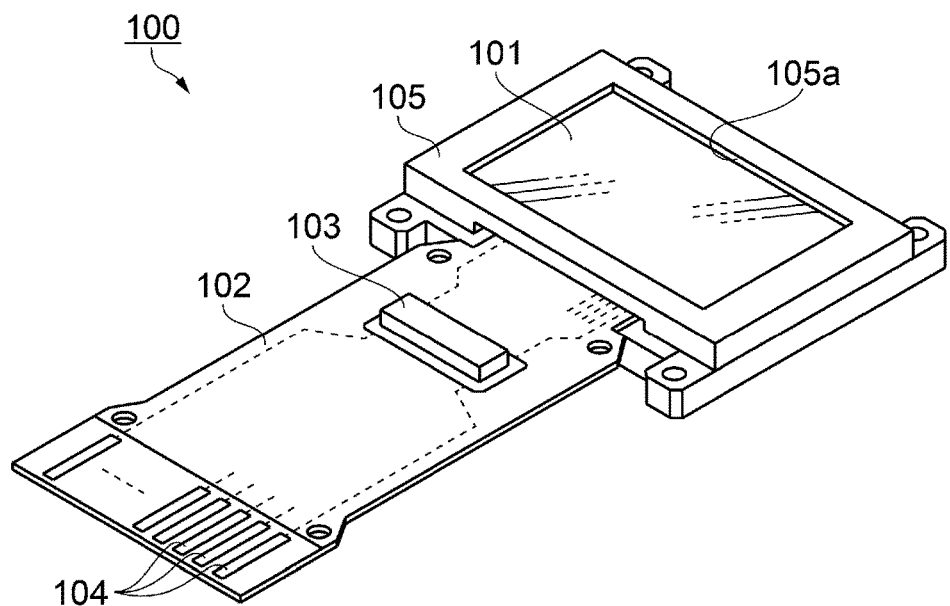
FIG. 2
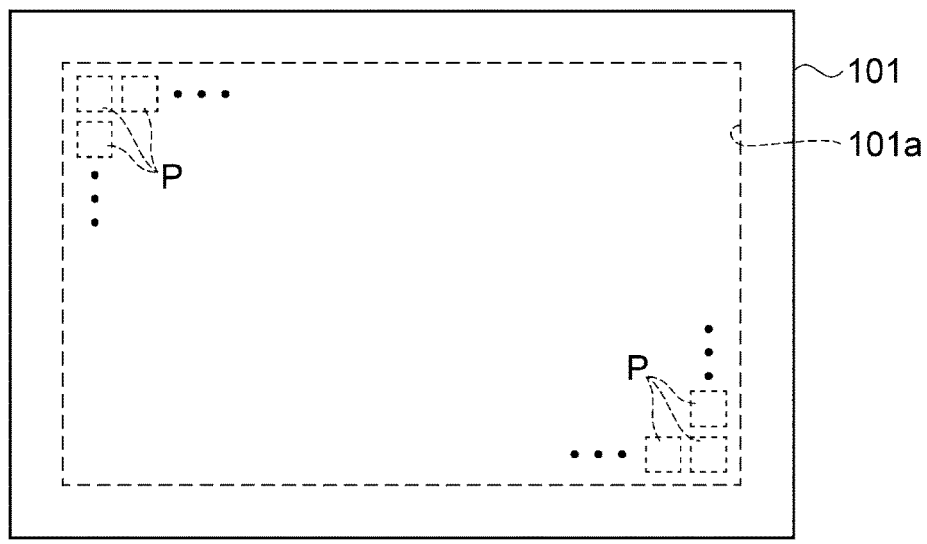
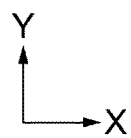

ELECTROOPTICAL DEVICE, ELECTRONIC APPARATUS, AND HEAD MOUNT DISPLAY

BACKGROUND

1. Technical Field

The present invention relates to an electrooptical device, an electronic apparatus, and a head mount display.

2. Related Art

As an electrooptical device, for example, a display device has been proposed (JP-A-2009-282190). In the display device, light emitting elements with a plurality of colors are formed on a substrate for each pixel, the light emitting elements including a light emitting element which emits blue light, a plurality of pixels are disposed in a matrix, the pixel being configured in units of sub-pixels with a plurality of colors, and a relative position relationship between transistors of each sub-pixel with each emission color and a light emitting portion of the light emitting element which emits blue light is laid out such that distances between the transistors of each sub-pixel and the light emitting portion are the same for each color.

According to the display device described in JP-A-2009-282190, even when a part of blue light with the highest energy leaks into adjacent pixels, a variation in characteristics of pixel transistors due to the leaked light can be reduced for each color.

In JP-A-2009-282190, in red (R), green (G), and blue (B) sub-pixels, a window insulating film is formed on an anode electrode, and R, G, B organic electro-luminescence (EL) elements as light emitting elements are provided in a recess portion of the window insulating film. A light emitting portion of the organic EL element with each color is an opening (window) in the recess portion of the window insulating film.

However, in the layout of the sub-pixels disclosed in JP-A-2009-282190, when a part of the blue light leaks into the adjacent sub-pixels with other colors, blue light mixes with other color light, and as a result, color mixing occurs. Especially, when viewing the sub-pixel from an oblique direction with respect to the normal direction of the sub-pixel, color mixing is likely to be visually recognized.

In addition, an arrangement of the light emitting portion, that is, the sub-pixels in the organic EL element is related to an arrangement of transistors for driving the organic EL element. Specifically, a contact for an electrical connection between the anode electrode and the transistor of the organic EL element is provided outside the recess portion of the window insulating film that defines the light emitting portion. For example, according to the arrangement of sub-pixels in a pixel formation region (pixel) described in an example 1 or an example 2 of JP-A-2009-282190, the red (R) and green (G) sub-pixels are disposed in a column direction with respect to the blue (B) sub-pixel, and the contact of the anode electrode is provided between the blue (B) sub-pixel and the red (R) sub-pixel and between the blue (B) sub-pixel and the green (G) sub-pixel in the column direction. For this reason, in one pixel formation region (pixel), a distance between the blue (B) sub-pixel and the red (R) sub-pixel and a distance between the blue (B) sub-pixel and the green (G) sub-pixel in the column direction are considered to be the same. On the other hand, in the pixels adjacent to each other in the column direction, the contact of the anode electrode is not provided between the blue (B) sub-pixel of one pixel and the red (R) sub-pixel of the other pixel and between the blue (B) sub-pixel of one pixel and the green (G) sub-pixel of the other pixel. For this reason, it is considered that the distance between the blue (B) sub-pixel of one pixel and the red (R) sub-pixel of the other pixel and the distance between the blue (B) sub-pixel of one pixel and the green (G) sub-pixel of the other pixel in the column direction are different from the distance between the sub-pixels in the pixel in the column direction. That is, it is considered that the distances between the sub-pixels are set to be different from each other in the row direction or the column direction or in the row direction and the column direction corresponding to the arrangement of the transistors for driving the organic EL element. In this case, a color mixing state changes depending on what the sub-pixel is viewed obliquely from which direction with respect to the normal direction of the sub-pixel. When such a color mixing state is referred to as color deviation which is caused by viewing angle, there is a problem that color deviation which is caused by viewing angle occurs.

SUMMARY

The invention can be realized in the following aspects or application examples.

Application Example

According to this application example, there is provided an electrooptical device including: a first sub-pixel, a first region, a second sub-pixel, a second region, a third sub-pixel, a third region, a fourth sub-pixel, and a fourth region, which are arranged in a first direction, preferably, in which the first sub-pixel and the second sub-pixel have different colors from each other, in which the third sub-pixel and the fourth sub-pixel have different colors from each other, in which the first region is a pixel contact region of the first sub-pixel, in which the second region is a pixel contact region of the second sub-pixel, in which the third region is a pixel contact region of the third sub-pixel, in which the fourth region is a pixel contact region of the fourth sub-pixel, and in which the first region, the second region, the third region, and the fourth region have the same length in the first direction.

In this configuration of this application example, a length of a region between the first sub-pixel and the second sub-pixel with different colors in the first direction is the same as a length of a region between the third sub-pixel and the fourth sub-pixel with different colors in the first direction. Thus, it is possible to reduce a difference in a color mixing state of the region between the sub-pixels with different colors, the difference being caused by viewing angle in the first direction. That is, it is possible to provide the electrooptical device capable of reducing color deviation which is caused by the viewing angle in the first direction. In addition, the region between the sub-pixels in the first direction is set as the pixel contact region, and the sub-pixels with different colors are partitioned by the pixel contact region. Thus, it is possible to realize an electrical connection between the sub-pixels with different colors. In other words, there is no need to provide a dedicated configuration for partition of the sub-pixels with different colors in the first direction.

The electrooptical device according to the application example further includes a fifth sub-pixel, a fifth region, a sixth sub-pixel, and a sixth region, which are arranged in the first direction. Preferably, the fifth sub-pixel is arranged in a second direction intersecting with the first direction with respect to the first sub-pixel and the second sub-pixel, the sixth sub-pixel is arranged in the second direction with respect to the third sub-pixel and the fourth sub-pixel, the fifth region is a pixel contact region of the fifth sub-pixel, the sixth region is a pixel contact region of the sixth sub-pixel, and the fifth region and the sixth region have the same length in the first direction.

In this configuration, the added regions between the fifth sub-pixel and the sixth sub-pixel also have the same length in the first direction. Therefore, it is possible to provide an electrooptical device capable of reducing the color deviation which is caused by the viewing angle in the first direction and performing color display with excellent visibility. In addition, each of the fifth region and the sixth region is set as the pixel contact region, and the fifth sub-pixel and the sixth sub-pixel are partitioned by the pixel contact region. Thus, it is possible to realize an electrical connection for each of the sub-pixels.

The electrooptical device according to the application example further includes a seventh region between the first and second sub-pixels and the fifth sub-pixel in the second direction, and an eighth region between the third and fourth sub-pixels and the sixth sub-pixel in the second direction. Preferably, the seventh region and the eighth region have the same length in the second direction.

In this configuration, it is possible to provide an electrooptical device capable of reducing the color deviation which is caused by the viewing angle in the first direction and the second direction.

In the electrooptical device according to the application example, preferably, the third sub-pixel, the third region, the fourth sub-pixel, and the fourth region are disposed along the first direction to be parallel to the first sub-pixel, the first region, the second sub-pixel, and the second region that are disposed in the first direction.

In this configuration, the sub-pixels with up to four colors are disposed at an equal interval in the first direction. Therefore, it is possible to provide the electrooptical device capable of reducing the color deviation which is caused by the viewing angle in the first direction and performing excellent color expression.

Application Example

According to this application example, there is provided an electrooptical device including: a first sub-pixel, a first region, a second sub-pixel, a second region, a third sub-pixel, a third region, a fourth sub-pixel, a fourth region, which are arranged in a first direction, a fifth region, a sixth region, a fifth sub-pixel, a seventh region, an eighth region, and a sixth sub-pixel, in which the fifth region, the first sub-pixel and the second sub-pixel, the sixth region, and the fifth sub-pixel are arranged in a second direction intersecting with the first direction, in which the seventh region, the third sub-pixel and the fourth sub-pixel, the eighth region, and the sixth sub-pixel are arranged in the second direction, in which the first sub-pixel and the second sub-pixel have different colors from each other, in which the third sub-pixel and the fourth sub-pixel have different colors from each other, in which the fifth region includes pixel contact regions of the first sub-pixel and the second sub-pixel, in which the sixth region is a pixel contact region of the fifth sub-pixel, in which the seventh region includes pixel contact regions of the third sub-pixel and the fourth sub-pixel, in which the eighth region is a pixel contact region of the sixth sub-pixel, and in which the fifth region, the sixth region, the seventh region, and the eighth region have the same length in the second direction.

In this configuration of this application example, the fifth sub-pixel is disposed in the second direction to be parallel to the first sub-pixel and the second sub-pixel with different colors that are arranged in the first direction, and the sixth sub-pixel is similarly disposed in the second direction to be parallel to the third sub-pixel and the fourth sub-pixel with different colors that are arranged in the first direction. A length of a region between the first sub-pixel and the second sub-pixel and the fifth sub-pixel in the second direction is the same as a length of a region between the third sub-pixel and the fourth sub-pixel and the sixth sub-pixel in the second direction. Thus, it is possible to reduce a difference in a color mixing state of the region between the sub-pixels with different colors, the difference being caused by viewing angle in the second direction. That is, it is possible to provide the electrooptical device capable of reducing the color deviation which is caused by the viewing angle in the second direction. In addition, the region between the sub-pixels in the second direction is set as the pixel contact region, and the sub-pixels with different colors and the other sub-pixels are partitioned by the pixel contact region. Thus, it is possible to realize an electrical connection for each sub-pixel. In other words, there is no need to provide a dedicated configuration for partition of the sub-pixels in the second direction.

In the electrooptical device according to the application example, preferably, lengths of the first region, the second region, the third region, and the fourth region in the first direction are the same as a length in the first direction of a ninth region between the fifth sub-pixel and the sixth sub-pixel in the first direction.

In this configuration, it is possible to provide an electrooptical device capable of reducing the color deviation which is caused by the viewing angle in the first direction in addition to the second direction.

In the electrooptical device according to the application example, preferably, the first sub-pixel and the third sub-pixel have the same color, and the other sub-pixels have colors different from the color of the first sub-pixel.

In this configuration, it is possible to prevent occurrence of the color deviation in a direction in which the first sub-pixel and the third sub-pixel are arranged and to be adjacent to each other. That is, it is possible to reduce a probability that the color deviation which is caused by the viewing angle occurs according to the arrangement of the sub-pixels.

In the electrooptical device according to the application example, preferably, the second sub-pixel and the third sub-pixel have the same color, and the other sub-pixels have colors different from the color of the second sub-pixel.

In this configuration, it is possible to prevent occurrence of the color deviation in a direction in which the second sub-pixel and the third sub-pixel are arranged and to be adjacent to each other. That is, it is possible to reduce a probability that the color deviation which is caused by the viewing angle occurs according to the arrangement of the sub-pixels.

In the electrooptical device according to the application example, preferably, an area of the fifth sub-pixel and an area of the sixth sub-pixel are larger than an area of each of the first sub-pixel, the second sub-pixel, the third sub-pixel, and the fourth sub-pixel, and the fifth sub-pixel and the sixth sub-pixel have a blue color.

In this configuration, a blue color has lower visibility than a red color or a green color having a wavelength longer than that of the blue color. Therefore, even when the fifth sub-pixel and the sixth sub-pixel with a blue color are disposed so as to be adjacent to the sub-pixels with other colors, the color deviation which is caused by the viewing angle is not conspicuous, and preferable white balance can be easily realized by setting an area of the fifth sub-pixel and an area of the sixth sub-pixel to be larger than areas of the other sub-pixels.

In the electrooptical device according to the application example, each of the first sub-pixel, the second sub-pixel, the third sub-pixel, and the fourth sub-pixel includes a light emitting element and a colored layer that converts light from the light emitting element into light in a predetermined wavelength range, and the pixel contact region is a non-light-emitting region.

In this configuration, it is possible to provide a self-emission type electrooptical device capable of reducing the color deviation which is caused by the viewing angle and performing color display with excellent visibility.

In the electrooptical device according to the application example, the light emitting element and the colored layer are provided on the same substrate.

In this configuration, as compared with a case where the light emitting element and the colored layer are provided on separate substrates, it is possible to improve relative arrangement accuracy of the colored layer with respect to the light emitting element, and thus, it is possible to provide a self-emission type electrooptical device in which the color deviation which is caused by the viewing angle hardly occurs.

Application Example

According to this application example, there is provided an electrooptical device including: a plurality of display units that are arranged in a first direction and a second direction intersecting with the first direction. Preferably, the display unit includes at least a first sub-pixel and a second sub-pixel with different colors. Preferably, in the display units adjacent in the first direction, each first region between the first sub-pixel and the second sub-pixel has the same length in the first direction, and the first region is a pixel contact region of one of the first sub-pixel and the second sub-pixel.

In this application example, in the display units adjacent in the first direction, each region between the first sub-pixel and the second sub-pixel with different colors has the same length in the first direction. Thus, it is possible to reduce a difference in a color mixing state of the region between the sub-pixels with different colors, the difference being caused by the viewing angle in the first direction. That is, it is possible to provide the electrooptical device capable of reducing the color deviation which is caused by the viewing angle in the first direction. In addition, the first region between the first sub-pixel and the second sub-pixel in the first direction is set as the pixel contact region, and the sub-pixels with different colors that are arranged in the first direction are partitioned by the pixel contact region. Thus, it is possible to realize an electrical connection for the sub-pixels with different colors. In other words, there is no need to provide a dedicated configuration for partition of the sub-pixels with different colors in the first direction.

In the electrooptical device according to the application example, preferably, the display unit further includes a third sub-pixel with a color different from the colors of the first sub-pixel and the second sub-pixel, the first sub-pixel and the second sub-pixel are arranged in the first direction, and the third sub-pixel is arranged in the second direction to be parallel to the first sub-pixel and the second sub-pixel. Preferably, in the display units adjacent in the first direction, a length of the first region in the first direction is the same as a length of a second region between the third sub-pixels in the first direction, and the second region is a pixel contact region of the third sub-pixel.

In this configuration, in the display units adjacent in the first direction, the third sub-pixels are also disposed at an equal interval. Therefore, for example, when the first sub-pixel with a red color, the second sub-pixel with a green color, and the third sub-pixel with a blue color are set, it is possible to provide an electrooptical device capable of reducing the color deviation which is caused by the viewing angle in the first direction and performing color display with excellent visibility.

In the electrooptical device according to the application example, preferably, in the display units adjacent in the second direction, each third region between the first sub-pixel and the second sub-pixel and the third sub-pixel has the same length in the second direction.

In this configuration, in the display units adjacent in the second direction, the third sub-pixels are also disposed at an equal interval to be parallel to the first sub-pixel and the second sub-pixel with different colors. Therefore, the color deviation which is caused by the viewing angle in the first direction and the second direction is reduced.

Application Example

According to this application example, there is provided an electrooptical device including: a plurality of display units that are arranged in a first direction and a second direction intersecting with the first direction. Preferably, the display unit includes a first sub-pixel, a second sub-pixel, and a third sub-pixel with different colors, the first sub-pixel and the second sub-pixel are arranged in the first direction, and the third sub-pixel is arranged in the second direction to be parallel to the first sub-pixel and the second sub-pixel. Preferably, in the display units adjacent in the first direction, a length of a first region between the first sub-pixel and the second sub-pixel in the first direction is the same as a length of a second region between the third sub-pixels in the first direction, and in the display units adjacent in the second direction, each third region between the first sub-pixel and the second sub-pixel and the third sub-pixel has the same length in the second direction. Preferably, the third region is a pixel contact region of one of the first sub-pixel, the second sub-pixel, and the third sub-pixel.

In this application example, in the display units adjacent in the first direction, the first sub-pixel, the second sub-pixel, and the third sub-pixel with different colors are disposed at an equal interval in the first direction. In addition, in the display units adjacent in the second direction, the first sub-pixel and the second sub-pixel with different colors, and the third sub-pixel are disposed at an equal interval in the second direction. Therefore, it is possible to reduce a difference in a color mixing state of the region between the sub-pixels with different colors, the difference being caused by the viewing angle in the first direction and the second direction. That is, the color deviation which is caused by the viewing angle in the first direction and the second direction is reduced. Further, the third region between the first sub-pixel and the second sub-pixel and the third sub-pixel is set as a pixel contact region of any one of the sub-pixels, and the sub-pixels with different colors that are arranged in the second direction are partitioned by the pixel contact region. Thus, it is possible to realize an electrical connection for the sub-pixels with different colors. In other words, there is no need to provide a dedicated configuration for partition of the sub-pixels with different colors in the second direction.

Application Example

According to this application example, there is provided an electronic apparatus including the electrooptical device according to the application example.

In this application example, it is possible to provide the electronic apparatus capable of reducing the color deviation which is caused by the viewing angle and performing color display with excellent visibility.

Application Example

According to this application example, there is provided a head mount display including the electrooptical device according to the application example, the electrooptical device being configured such that a displayed image is recognized by at least one eye of both eyes.

In this application example, it is possible to provide the head mount display capable of reducing the color deviation which is caused by the viewing angle in at least the first direction and configured such that display can be recognized with excellent visibility. In particular, by applying the electrooptical device according to the application example for both eyes, it is possible to reduce discomfort due to the color deviation of an image recognized by both eyes, and thus it is possible to provide the head mount display with little fatigue in image recognition even when used for longer periods of time.

BRIEF DESCRIPTION OF THE DRAWINGS

The invention will be described with reference to the accompanying drawings, wherein like numbers reference like elements.

FIG. 1 is a perspective view illustrating a configuration of an electrooptical device according to a first embodiment.

FIG. 2 is a schematic plan view illustrating an arrangement of display units (pixels) of a display panel.

DESCRIPTION OF EXEMPLARY EMBODIMENTS

Figure 3:
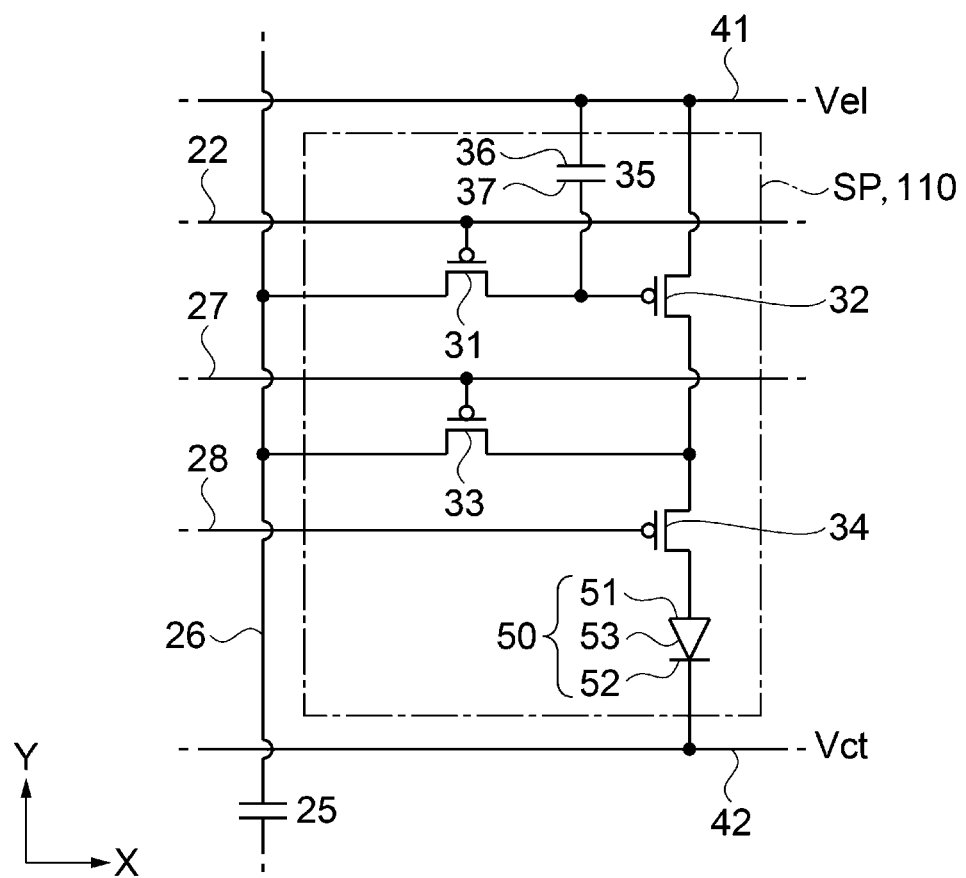
FIG. 3 is a circuit diagram illustrating a pixel circuit of a sub-pixel.

Hereinafter, embodiments according to the invention will be described with reference to the drawings. In the drawings used for description are illustrated by being enlarged or reduced as appropriate such that a portion to be explained can be recognized.

First Embodiment

Electrooptical Device

First, a basic configuration example of an electrooptical device according to the present embodiment will be described with reference to FIGS. 1 and 2. FIG. 1 is a perspective view illustrating a configuration of the electrooptical device, and FIG. 2 is a schematic plan view illustrating an arrangement of display units (pixels) of a display panel.

The electrooptical device 100 according to the present embodiment is a display device capable of color display, and includes a display panel 101, a flexible printed circuit board 102 on which a driver IC 103 for driving the display panel 101 is mounted (hereinafter, referred to as an FPC 102), and a frame body 105 for housing the display panel 101 and fixing the display panel 101 to a support base or the like.

The FPC 102 is electrically connected to the display panel 101, and includes a plurality of external connection terminals 104 for inputting input signals such as image information to the driver IC 103 from an external circuit.

The frame body 105 is provided with a window frame (opening) 105a through which display of the display panel 101 can be visually recognized.

As illustrated in FIG. 2, the display panel 101 includes an oblong display region 101a, and in the display region 101a, a plurality of pixels P as display units are arranged in a matrix shape and at a predetermined arrangement pitch. In addition, in FIG. 2, although not illustrated, the pixel P includes at least one sub-pixel SP capable of displaying one of blue (B), green (G), and red (R). The sub-pixel SP includes an organic electroluminescence (EL) element as a light emitting element, and a colored layer which converts light emitted from the organic EL element into light (color light) in a predetermined wavelength range. Although a detailed configuration of the pixel P (including the sub-pixels SPs) will be described later, a row direction and a column direction in the arrangement of the pixels P are respectively described as an X direction and a Y direction. In the present embodiment according to the invention, the X direction is an example of a first direction, and the Y direction is an example of a second direction intersecting with the first direction.

The display panel 101 is a microdisplay with which a diagonal length of the display region 101a is less than, for example, one inch (approximately 25.4 mm). A pixel density of the display region 101a is, for example, 3300 ppi (pixel per inch).

The self-emission type electrooptical device 100 provided with the display panel 101 is suitably used as a display unit of, for example, a head mount display as an electronic apparatus to be described.

Electrical Configuration of Sub-Pixel

Next, an electrical configuration of the sub-pixel SP of the electrooptical device 100 will be described with reference to FIG. 3. FIG. 3 is a circuit diagram illustrating a pixel circuit of the sub-pixel.

As illustrated in FIG. 3, the pixel circuit 110 of the sub-pixel SP includes four transistors 31, 32, 33, and 34, an organic EL element 50, and a storage capacitor 35. In the display region 101a of the display panel 101 illustrated in FIG. 2, a scanning line 22, a data line 26, a first control line 27, a second control line 28, a first power supply line 41, and a second power supply line 42, which are signal wirings for electrical connections between the components of the pixel circuit 110, are provided.

The pixel circuit 110 is provided between the first power supply line 41 and the second power supply line 42. The scanning line 22, the first control line 27, and the second control line 28 are provided extending in the X direction so as to extend across a plurality of pixel circuits 110 arranged in the X direction. The data line 26 is provided extending in the Y direction so as to extend across the plurality of pixel circuits 110 arranged in the Y direction. A capacitance element 25 is connected to an input side of the data line 26 in series.

The pixel circuit 110 includes a write control transistor 31, a driving transistor 32, a compensation transistor 33, and a light emitting control transistor 34. In the present embodiment, although the transistors are P-channel transistors, N-channel transistors may be used for the transistors.

The organic EL element 50 as a light emitting element is an element which includes a first electrode 51 as an anode, a second electrode 52 as a cathode, and a light emitting function layer 53 interposed between the electrodes. The first electrode 51 is a pixel electrode provided for each pixel circuit 110 (sub-pixel SP), and hereinafter is referred to as a pixel electrode 51. The second electrode 52 is a common electrode provided in common across the plurality of pixel circuits 110 (sub-pixels SPs), is disposed across the display region 101a illustrated in FIG. 2, and hereinafter is referred to as a common electrode 52.

The light emitting function layer 53 of the organic EL element 50 includes a light emitting layer including an organic light emitting material. In the present embodiment, white light emission can be obtained from the light emitting function layer 53.

As illustrated in FIG. 3, the organic EL element 50 is connected between the first power supply line 41 and the second power supply line 42 via the driving transistor 32 and the light emitting control transistor 34. A high power-supply potential Vel is supplied to the first power supply line 41. A low power-supply potential (for example, a ground potential) Vct is supplied to the second power supply line 42.

The first power supply line 41 is connected to one current terminal (a source or a drain) of a pair of current terminals of the driving transistor 32. The other current terminal (the source or the drain) of the pair of current terminals of the driving transistor 32 is connected to one current terminal (a source or a drain) of a pair of current terminals of the light emitting control transistor 34. The other current terminal (the source or the drain) of the pair of current terminals of the light emitting control transistor 34 is connected to the pixel electrode 51 of the organic EL element 50. The common electrode 52 of the organic EL element 50 is connected to the second power supply line 42.

A gate of the write control transistor 31 is connected to the scanning line 22, one current terminal (a source or a drain) of a pair of current terminals of the write control transistor 31 is connected to the data line 26, and the other current terminal (the source or the drain) of the pair of current terminals of the write control transistor 31 is connected to a gate of the driving transistor 32. Among a pair of capacitor electrodes 36 and 37 of the storage capacitor 35, one capacitor electrode 36 is connected to the first power supply line 41, and the other capacitor electrode 37 is connected to the other current terminal of the pair of current terminals of the write control transistor 31.

A gate of the compensation transistor 33 is connected to the first control line 27, one current terminal (a source or a drain) of a pair of current terminals of the compensation transistor 33 is connected to the data line 26, and the other current terminal (the source or the drain) of the pair of current terminals of the compensation transistor 33 is connected to the other current terminal (the source or the drain) of the pair of current terminals of the light emitting control transistor 34. A gate of the light emitting control transistor 34 is connected to the second control line 28.

The scanning line 22 is connected to a scanning line driving circuit which supplies a scanning signal. The data line 26 is connected to one end of the capacitance element 25, the other end of the capacitance element 25 is connected to a data line driving circuit which supplies a data signal based on an image signal. Thus, the data signal is supplied to the capacitance element 25, and the potential corresponding to the data signal is supplied to the data line 26.

In the present embodiment, a horizontal scanning period includes a compensation period and a write period, and the scanning line driving circuit sequentially selects each of a plurality of scanning lines 22 for each horizontal scanning period by supplying the scanning signal to the scanning line 22. The write control transistor 31 of the pixel circuit 110 that corresponds to the scanning line 22 selected by the scanning line driving circuit transitions to an ON state. Thus, the driving transistor 32 of the pixel circuit 110 also transitions to the ON state. In addition, the scanning line driving circuit sequentially selects each of a plurality of first control lines 27 for each compensation period by supplying a control signal to the first control line 27. The compensation transistor 33 of the pixel circuit 110 that corresponds to the first control line 27 selected by the scanning line driving circuit transitions to the ON state. The storage capacitor 35 holds a threshold voltage |Vth| of the driving transistor 32 until the end of the compensation period during which the compensation transistor 33 is in an OFF state. When the scanning line driving circuit performs a control so as to switch the compensation transistor 33 of the pixel circuit 110 into the OFF state by supplying the control signal to the first control line 27, a path from the data line 26 to a gate electrode of the driving transistor 32 becomes a floating state. On the other hand, a gate potential of the driving transistor 32 is maintained at a potential of (Vel−|Vth|) by the storage capacitor 35. Next, the data line driving circuit supplies a gradation potential (data signal) corresponding to a gradation, which is designated for each pixel circuit 110 by the image signal supplied from the external circuit, to the capacitance element 25 for each write period in parallel. A level of the gradation potential is shifted by using the capacitance element 25, and the potential is supplied to the gate of the driving transistor 32 of the pixel circuit 110 via the data line 26 and the write control transistor 31. The storage capacitor 35 holds a voltage corresponding to the gradation potential while compensating the threshold voltage |Vth| of the driving transistor 32. On the other hand, when the selection of the scanning line 22 is completed in the write period, the scanning line driving circuit performs a control so as to switch the light emitting control transistor 34 of the pixel circuit 110 that corresponds to the second control line 28 into the ON state, by supplying the control signal to the second control line 28. Thus, a driving current corresponding to the voltage which is held in the storage capacitor 35 in the previous write period is supplied to the organic EL element 50 via the driving transistor 32 and the light emitting control transistor 34. The organic EL element 50 emits light with brightness corresponding to a current amount of the driving current. In this manner, the organic EL element 50 emits light with brightness corresponding to the gradation potential, and thus an arbitrary image designated by the image signal is displayed. In the driving current which is supplied to the organic EL element 50 from the driving transistor 32, an influence of the threshold voltage is canceled out. Thus, even when the threshold voltage of the driving transistor 32 varies for each pixel circuit 110, the variation is compensated. In addition, the driving current corresponding to a gradation level is supplied to the organic EL element 50, and thus occurrence of display unevenness that degrades uniformity of a display screen can be suppressed. Thereby, high-quality display can be realized.

The pixel circuit 110 is not limited to the configuration including the four transistors 31, 32, 33, and 34. For example, when a variation in the threshold voltage of the driving transistor 32 for each pixel circuit 110 is small, the pixel circuit 110 may be configured without the compensation transistor 33. In addition, the configurations of the signal wirings are not limited thereto. For example, although the scanning line 22 and the first control line 27 are configured with different wirings, the scanning line 22 and the first control line 27 may be configured with one wiring.

Structure of Pixel

Figure 4:
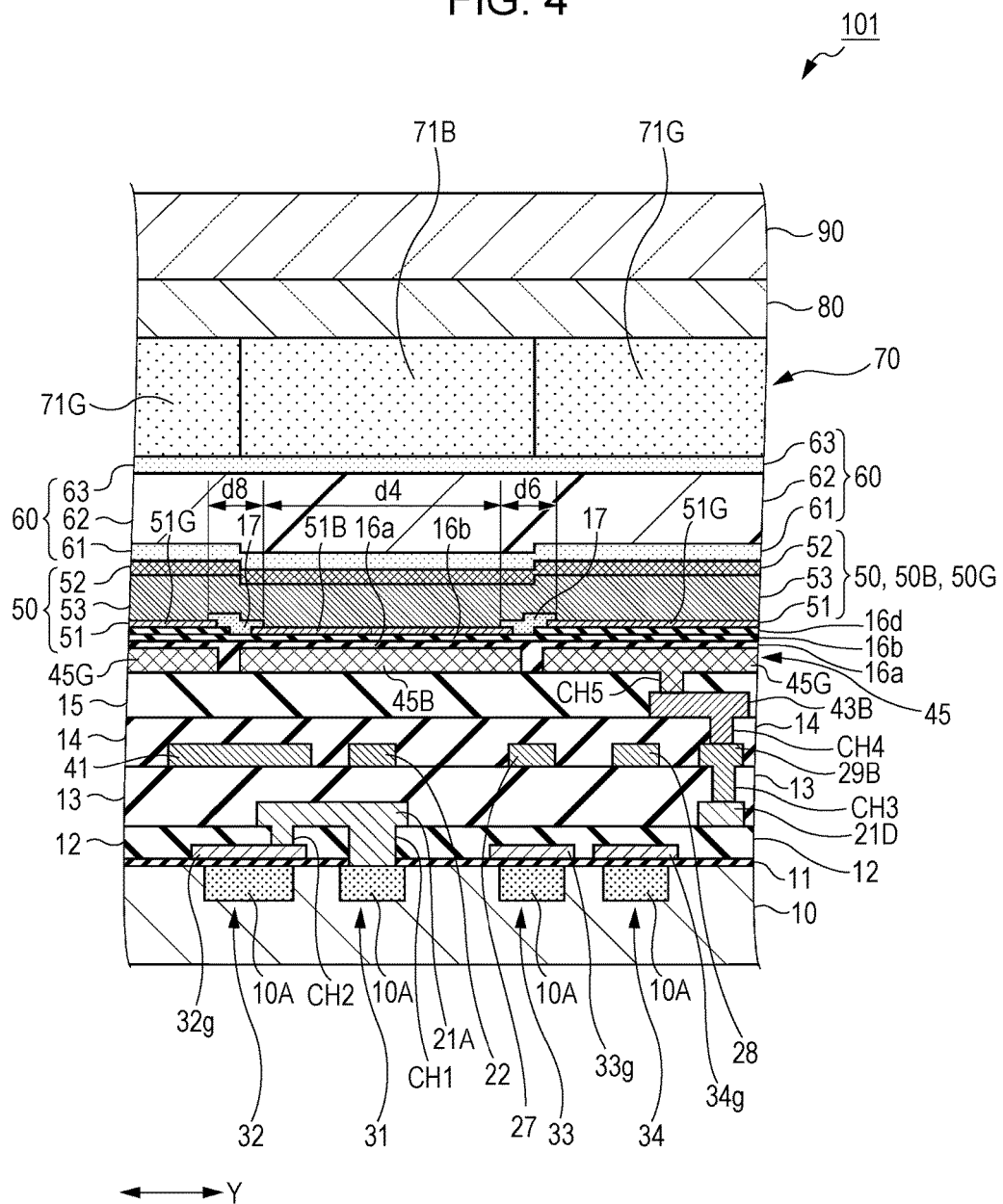
FIG. 4 is a schematic sectional view illustrating structures of blue (B) and green (G) sub-pixels.
Figure 5:
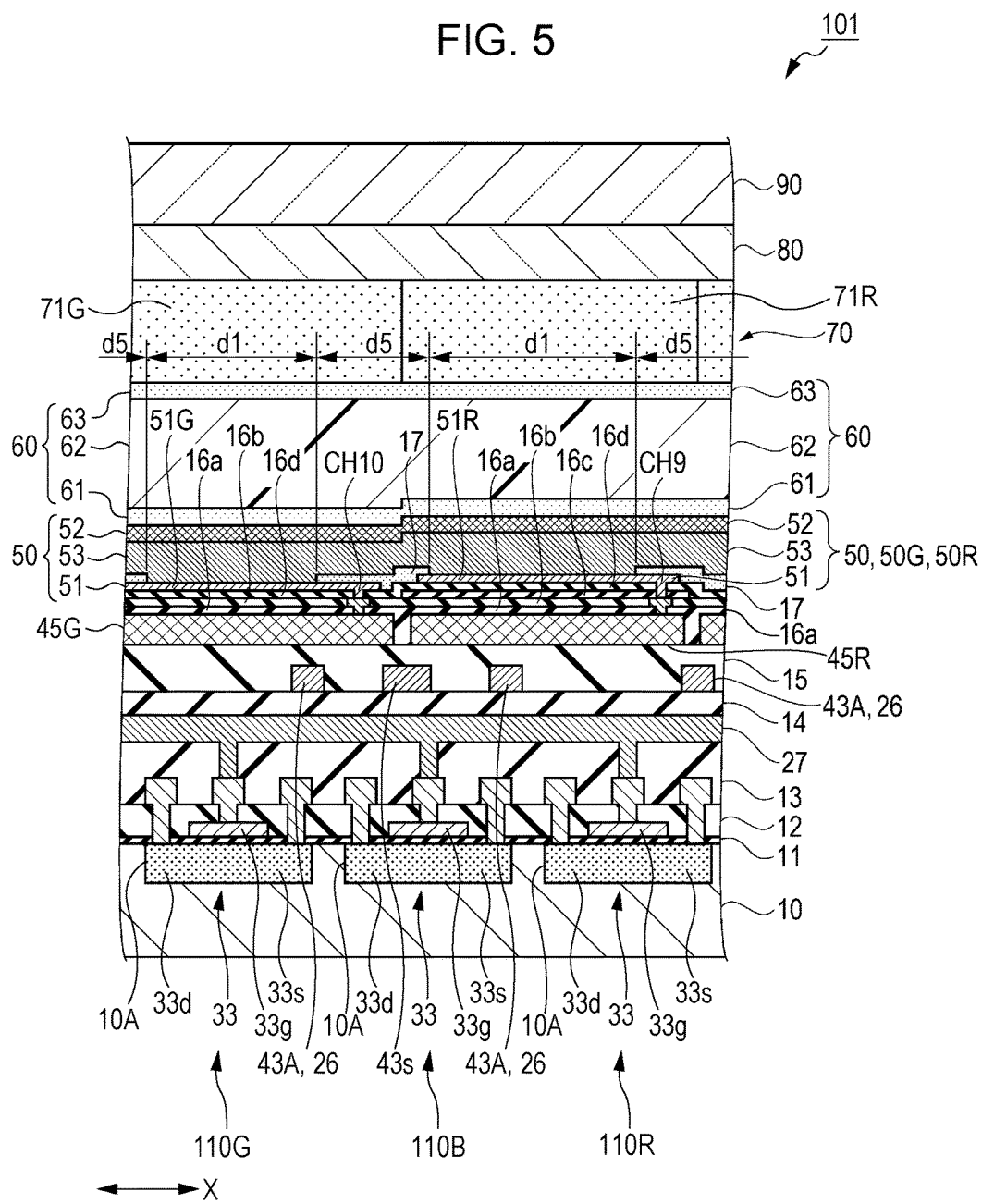
FIG. 5 is a schematic sectional view illustrating structures of green (G) and red (R) sub-pixels.

Next, a structure of the pixel P (including the sub-pixels SPs) will be described with reference to FIGS. 4 to 10. FIGS. 4 and 5 are schematic sectional views illustrating structures of the sub-pixels. FIG. 4 is a schematic sectional view illustrating structures of a blue (B) sub-pixel SP and a green (G) sub-pixel SP, and FIG. 5 is a schematic sectional view illustrating structures of a green (G) sub-pixel SP and a red (R) sub-pixel SP. Specifically, FIG. 4 is a schematic sectional view taken along a line IV-IV illustrated in an arrangement of the sub-pixels of FIG. 10 to be described, the line along which the four transistors 32, 31, 33, and 34 are disposed and the blue (B) and green (G) sub-pixels are disposed in the Y direction. Similarly, FIG. 5 is a schematic sectional view taken along a line V-V illustrated in the arrangement of the sub-pixels of FIG. 10, the line along which the three transistors 33 are disposed and the green (G) and red (R) sub-pixels are disposed in the X direction. The display panel 101 according to the present embodiment includes the organic EL element 50 as a light emitting element and a colored layer 71 that are formed on the same substrate for each sub-pixel SP.

As illustrated in FIGS. 4 and 5, in the present embodiment, each of the four transistors 31, 32, 33 and 34 included in the pixel circuit 110 includes an active region 10A formed by, for example, implanting impurity ions into one surface of a semiconductor substrate 10 as a substrate such as silicon. That is, the four transistors 31, 32, 33, and 34 are metal-oxide-semiconductor-field-effect-transistors (MOSFETs). The active region 10A includes a region functioning as a source or a drain that is formed by implanting impurity ions with a high concentration, and a region functioning as a gate that is formed by implanting impurity ions with a low concentration or without implanting impurity ions. In FIGS. 4 and 5, for convenience of description, the regions are collectively illustrated as one region.

A gate insulating film 11 is formed on the semiconductor substrate 10 so as to cover the active region 10A. A gate electrode is formed on a portion of the gate insulating film 11, the portion being opposite to the region functioning as a gate that is included in the active region 10A. In FIG. 4, the gate electrode 32*g* of the driving transistor 32, the gate electrode 33*g* of the compensation transistor 33, and the gate electrode 34*g* of the light emitting control transistor 34 are illustrated. Of course, similarly, the gate electrode of the write control transistor 31 is also formed. A first interlayer insulating film 12 is formed so as to cover the gate electrodes. In addition, a through hole, which penetrates through the first interlayer insulating film 12 and the gate insulating film 11 and reaches, for example, the region functioning as the source or the drain of the write control transistor 31, is provided. In addition, a through hole, which penetrates through the first interlayer insulating film 12 and reaches, for example, the gate electrode 32*g* of the driving transistor 32, is provided. A conductive film is formed so as to cover the through holes, and the conductive film is patterned. Thereby, a contact hole CH1 and a contact hole CH2 are formed, the contact hole CH1 being brought into contact with, for example, the region functioning as the source or the drain of the write control transistor 31, and the contact hole CH2 being brought into contact with, for example, the gate electrode 32*g* of the driving transistor 32. In addition, a wiring 21A, which connects the contact hole CH1 and the contact hole CH2, is formed. That is, the wiring 21A, which connects the source or the drain of the write control transistor 31 and the gate of the driving transistor 32, is formed. On the first interlayer insulating film 12, not only the wiring 21A but also a wiring 21D for a connection between the transistor 32 and the transistors 33 and 34 is similarly formed. Although not illustrated in FIG. 4, the wiring 21D is connected to the other current terminal of the pair of current terminals of the light emitting control transistor 34.

A second interlayer insulating film 13, which covers the wiring 21A and the wiring 21D, is formed. In addition, a through hole, which penetrates through the second interlayer insulating film 13 and reaches, for example, the wiring 21D, is formed. A conductive film is formed so as to cover the through hole, and the conductive film is patterned. Thereby, a relay layer 29B, which is connected to the wiring 21D via a contact hole CH3, is formed. In addition, by patterning the conductive film, each of the scanning line 22, the first control line 27, the second control line 28, and the first power supply line 41 is formed in the same layer as the relay layer 29B.

A third interlayer insulating film 14, which covers the scanning line 22, the first control line 27, the second control line 28, the first power supply line 41, and the relay layer 29B, is formed. In addition, a through hole, which penetrates through the third interlayer insulating film 14 and reaches, for example, the relay layer 29B, is formed. A conductive film is formed so as to cover the through hole, and the conductive film is patterned. Thereby, a relay wiring 43B, which is connected to the relay layer 29B via a contact hole CH4, is formed.

A fourth interlayer insulating film 15, which covers the relay wiring 43B, is formed. In addition, a through hole, which penetrates through the fourth interlayer insulating film 15 and reaches, for example, the relay wiring 43B, is formed. A conductive film with light reflectivity is formed so as to cover the through hole, and the conductive film is patterned. Thereby, reflection layers 45B and 45G, which correspond to the blue (B) sub-pixel SP and the green (G) sub-pixel SP, are formed. For example, the reflection layer 45G is connected to the relay wiring 43B via a contact hole CH5 provided in the fourth interlayer insulating film 15. In addition, as illustrated in FIG. 5, the reflection layer 45R corresponding to the red (R) sub-pixel SP is similarly formed. In the following description, the reflection layers 45B, 45G, and 45R, which are formed on the same wiring layer, may be simply referred to as reflection layers 45.

As illustrated in FIG. 4, a first insulating layer 16a is formed so as to cover the reflection layers 45. In addition, in the blue (B) sub-pixel SP, a second insulating layer 16b is formed on the first insulating layer 16a by patterning. A pixel electrode 51B is formed on the second insulating layer 16b by patterning. In the green (G) sub-pixel SP, the second insulating layer 16b and a fourth insulating layer 16d are formed on the first insulating layer 16a by patterning. A pixel electrode 51G is formed on the fourth insulating layer 16d by patterning. As illustrated in FIG. 5, in the red (R) sub-pixel SP, the second insulating layer 16b, a third insulating layer 16c, and the fourth insulating layer 16d are respectively formed on the first insulating layer 16a by patterning. A pixel electrode 51R is formed on the fourth insulating layer 16d by patterning. That is, the third insulating layer 16c is formed corresponding to the red (R) sub-pixel SP, and the fourth insulating layer 16d is formed corresponding to the green (G) sub-pixel SP and the red (R) sub-pixel SP.

As illustrated in FIG. 4, a fifth insulating layer 17 for ensuring insulation between the pixel electrodes 51B and 51G is formed. The fifth insulating layer 17 is formed so as to cover outer edges of each of the pixel electrodes 51B and 51G and to have an opening on each of the pixel electrodes 51B and 51G. The opening defines a light emitting region in the blue (B) sub-pixel SP and the green (G) sub-pixel SP. As illustrated in FIG. 5, even in the red (R) sub-pixel SP, the fifth insulating layer 17 is formed by patterning so as to cover outer edges of the pixel electrode 51R, and an opening which defines a light emitting region is formed by the fifth insulating layer 17.

The light emitting function layer 53 is formed so as to cover each of the pixel electrodes 51B and 51G and the fifth insulating layer 17. A conductive film having both of light transmittance and light reflectivity is formed so as to cover the light emitting function layer 53, and the conductive film is patterned, thereby forming the common electrode 52. Thus, the top-emission-type organic EL element 50 is formed for each of the blue (B) sub-pixel SP and the green (G) sub-pixel SP. As illustrated in FIG. 5, in the red (R) sub-pixel SP, similarly, the top-emission-type organic EL element 50 is also formed.

As a transparent conductive film constituting the pixel electrodes 51B, 51G, and 51R, for example, an indium-tin-oxide (ITO) film, which has a work function in consideration of a hole injection property into the light emitting function layer 53, is used. As the common electrode 52 having both of light transmittance and light reflectivity, for example, an alloy of Mg and Ag is used. For example, a metal thin film such as Li, Mg, or Ca may be provided between the light emitting function layer 53 and the common electrode 52, the metal thin film having a work function in consideration of an electron injection property into the light emitting function layer 53.

As described above, the light emitting function layer 53 includes the light emitting layer capable of emitting white light. The present embodiment has a top emission structure in which light in a specific wavelength range corresponding to each color is emitted from the organic EL element 50, by adopting an optical resonance structure for each of the blue (B) sub-pixel SP, the green (G) sub-pixel SP, and the red (R) sub-pixel SP. In the optical resonance structure, by making optical distances between the reflection layers 45 and the common electrode 52 different from each other for each of the blue (B) sub-pixel SP, the green (G) sub-pixel SP, and the red (R) sub-pixel SP, light in a resonance wavelength range corresponding to each color is emitted from the organic EL element 50. The present embodiment adopts an optical resonance structure in which the optical distances between the reflection layers 45 and the pixel electrodes 51 are made different from each other by making layer configurations of the insulating layers between the reflection layers 45 and the pixel electrodes 51 different from each other. Specifically, since a green color and a red color have resonance wavelengths longer than that of a blue color, the first insulating layer 16a and the second insulating layer 16b are present between the reflection layer 45B and the pixel electrode 51B, and the first insulating layer 16a, the second insulating layer 16b, and the fourth insulating layer 16d are present between the reflection layer 45G and the pixel electrode 51G. In addition, as illustrated in FIG. 5, the first insulating layer 16a, the second insulating layer 16b, the third insulating layer 16c, and the fourth insulating layer 16d are present between the reflection layer 45R and the pixel electrode 51R. Thereby, when the light emitting function layer 53 having a uniform film thickness is formed so as to cover the pixel electrodes 51B, 51G, and 51R, the optical distance between the reflection layer 45B and the common electrode 52 in the blue (B) sub-pixel SP is the shortest, and the optical distance between the reflection layer 45R and the common electrode 52 in the red (R) sub-pixel SP is the longest. The optical resonance structure is not limited to the configuration in which the layer configurations of the insulating layers between the reflection layers 45B, 45G, and 45R and the pixel electrodes 51B, 51G, 51R are made different from each other. The optical resonance structure may have a configuration in which the optical distances between the reflection layers 45 and the pixel electrodes 51 are made different from each other by making the total thickness of the insulating layers between the reflection layers 45 and the pixel electrodes 51 constant and making thicknesses of the pixel electrodes 51B, 51G, and 51R different from each other for each of the blue (B) sub-pixel SP, the green (G) sub-pixel SP, and the red (R) sub-pixel SP. Hereinafter, the organic EL elements 50 provided in the blue (B) sub-pixel SP, the green (G) sub-pixel SP, and the red (R) sub-pixel SP with the optical resonance structure are referred to as organic EL elements 50B, 50G and 50R.

Next, as illustrated in FIGS. 4 and 5, a sealing layer 60 is formed so as to cover the common electrode 52. The sealing layer 60 protects the organic EL elements 50B, 50G, and 50R such that moisture or oxygen does not enter into the elements. In addition, in order to form a color filter 70 on the sealing layer 60 thereafter, the sealing layer 60 is configured in consideration of promotion of planarization. Specifically, the sealing layer 60 is formed by stacking a first inorganic sealing film 61, an organic sealing film 62, and a second inorganic sealing film 63 in this order. As the first inorganic sealing film 61 and the second inorganic sealing film 63, for example, a silicon oxide film, a silicon nitride film, or a silicon oxynitride film, which is unlikely to permeate a gas such as moisture or oxygen, is used. As the organic sealing film 62, for example, an acrylic transparent resin or the like, which can promote planarization by coating a surface with projections by using a spin coating method, a printing method, or the like, is used.

A color filter 70 is formed on the sealing layer 60. The color filter 70 has colored layers 71B, 71G, and 71R corresponding to the blue (B) sub-pixel SP, the green (G) sub-pixel SP, and the red (R) sub-pixel SP. As a method of forming the color filter 70, a photolithography method by which the colored layers 71B, 71G, and 71R are formed in order by applying a photosensitive resin including a coloring material and exposing and developing the photosensitive resin, may be used. The order of forming the colored layers 71B, 71G, and 71R is not limited to the order of blue (B), green (G), and red (R). In addition, in order to obtain desired optical characteristics, the film thicknesses of the colored layers 71B, 71G, and 71R may be different for each color. Hereinafter, the colored layers 71B, 71G, and 71R are collectively referred to as the colored layer 71 in some cases.

As described above, starting from the pixel circuit 110 including the four transistors 31, 32, 33, and 34, the organic EL elements 50B, 50G, and 50R, the sealing layer 60, and the color filter 70 are formed on the semiconductor substrate 10. A transparent counter substrate 90 is similarly adhered to the semiconductor substrate 10 on which the components are formed via a transparent adhesive layer 80, thereby forming the display panel 101. The counter substrate 90 functions as a protective substrate for protecting the organic EL elements 50B, 50G, and 50R, the color filter 70, and the like formed on the semiconductor substrate 10.

Next, a structure of a pixel contact region will be described with reference to FIGS. 4 and 5. The pixel contact region of the invention indicates a region in which a contact hole for connecting the reflection layer 45 functioning as an electrical relay wiring and the pixel electrode 51 is formed, or a non-light-emitting region including a contact hole in each of the blue (B) sub-pixel SP, the green (G) sub-pixel SP, and the red (R) sub-pixel SP.

As illustrated in FIG. 4, in the green (G) sub-pixel SP according to the present embodiment, the relay wiring 43B formed on the third interlayer insulating film 14 is connected to the reflection layer 45G via the contact hole CH5 which penetrates through the fourth interlayer insulating film 15. As illustrated in FIG. 5, the reflection layer 45G is connected to the pixel electrode 51G via a contact hole CH10 which penetrates through the first insulating layer 16a, the second insulating layer 16b, and the fourth insulating layer 16d. Since the organic EL element 50G is a top-emission-type element, the contact hole CH5 provided below the reflection layer 45G does not affect the light emission from the organic EL element 50G. Thus, determination of positions of the relay wiring 43B and the contact hole CH5 in the wiring layer has a certain degree of freedom. On the other hand, since a position of the contact hole CH10 in the wiring layer that is provided on the reflection layer 45G affects the light emission from the organic EL element 50G, the contact hole CH10 is provided at a position which does not overlap with the opening of the fifth insulating layer 17 that defines the light emitting region. That is, a portion of the pixel electrode 51G that overlaps with the contact hole CH10 is covered by the fifth insulating layer 17 and is electrically insulated from the light emitting function layer 53, and thus the region of the pixel electrode 51G that overlaps with the contact hole CH10 is a non-light-emitting region. In addition, the contact hole CH5 and the contact hole CH10 are provided at different positions. That is, the portion of the fifth insulating layer 17 that is formed so as to overlap with the contact hole CH10 in plan view is a pixel contact region of the green (G) sub-pixel SP.

In addition, as illustrated in FIG. 5, in the red (R) sub-pixel SP, the reflection layer 45R is connected to the pixel electrode 51R via a contact hole CH9 which penetrates through the first insulating layer 16a, the second insulating layer 16b, the third insulating layer 16c, and the fourth insulating layer 16d. Since the organic EL element 50R is also a top-emission-type element, a position of the contact hole CH9 in the wiring layer that is provided on the reflection layer 45R affects the light emission from the organic EL element 50R. Thus, similar to the green (G) sub-pixel SP, the contact hole CH9 is provided at a position which does not overlap with the opening of the fifth insulating layer 17 that defines the light emitting region. That is, a portion of the pixel electrode 51R that overlaps with the contact hole CH9 is covered by the fifth insulating layer 17 and is electrically insulated from the light emitting function layer 53, and thus the region of the pixel electrode 51R that overlaps with the contact hole CH9 is a non-light-emitting region. That is, the portion of the fifth insulating layer 17 that is formed so as to overlap with the contact hole CH9 in plan view is a pixel contact region of the red (R) sub-pixel SP. Although not illustrated in FIGS. 4 and 5, in the blue (B) sub-pixel SP, the reflection layer 45B is connected to the pixel electrode 51B via a contact hole CH11 which penetrates through the first insulating layer 16a and the second insulating layer 16b. The contact hole CH11 is also covered by the fifth insulating layer 17. That is, the portion of the fifth insulating layer 17 that is formed so as to overlap with the contact hole CH11 in plan view is a pixel contact region of the blue (B) sub-pixel SP.

In the present embodiment, from a viewpoint of forming the contact holes CH9, CH10, and CH11 by penetrating a plurality of insulating layers, as illustrated in FIG. 5, a relay portion for connecting the pixel electrode 51 and the reflection layer 45 is formed by forming a hole which penetrates through the first insulating layer 16a and the second insulating layer 16b. Thereafter, in the green (G) sub-pixel SP, the fourth insulating layer 16d is formed by patterning so as not to cover the relay portion. In the red (R) sub-pixel SP, the third insulating layer 16c and the fourth insulating layer 16d are formed by patterning so as not to cover the relay portion. A transparent conductive film is formed by patterning so as to come in contact with the relay portions of each sub-pixel SP, thereby forming the pixel electrodes 51B, 51G, and 51R and the contact holes CH9, CH10, and CH11 including the relay portions. That is, in order to electrically connect the reflection layer 45 and the pixel electrode 51, the relay portions are formed in advance. Thus, a distance for the electrical connection becomes short, and the contact holes CH9, CH10, and CH11 can be easily formed.

In FIG. 5, the compensation transistor 33 of which the gate electrode 33g is connected to the first control line 27 is illustrated. As described above, a drain region 33d and a source region 33s are provided in the active region 10A of the semiconductor substrate 10.

In the present embodiment, although the four transistors 31, 32, 33, and 34 in the pixel circuit 110 are configured by MOSFETs, the transistors are not limited thereto, and for example, thin film transistors (TFTs) may be used.

Electrical Arrangement Configuration of Pixels

Figure 6:
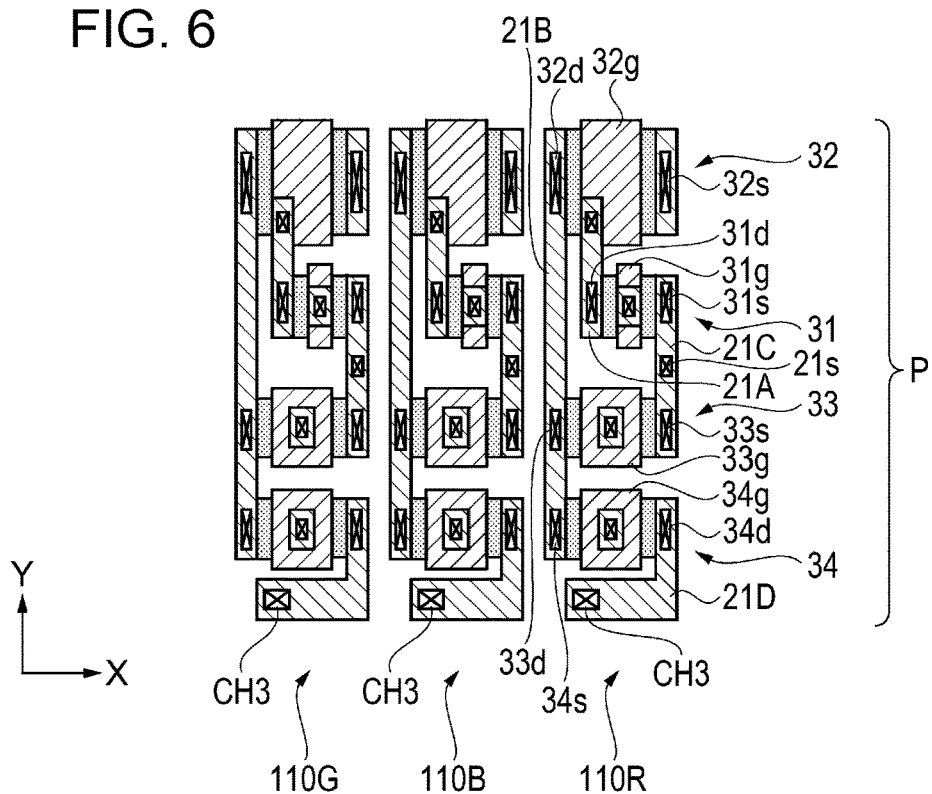
FIG. 6 is a schematic plan view illustrating an electrical arrangement configuration of pixels in a wiring layer.
Figure 7:
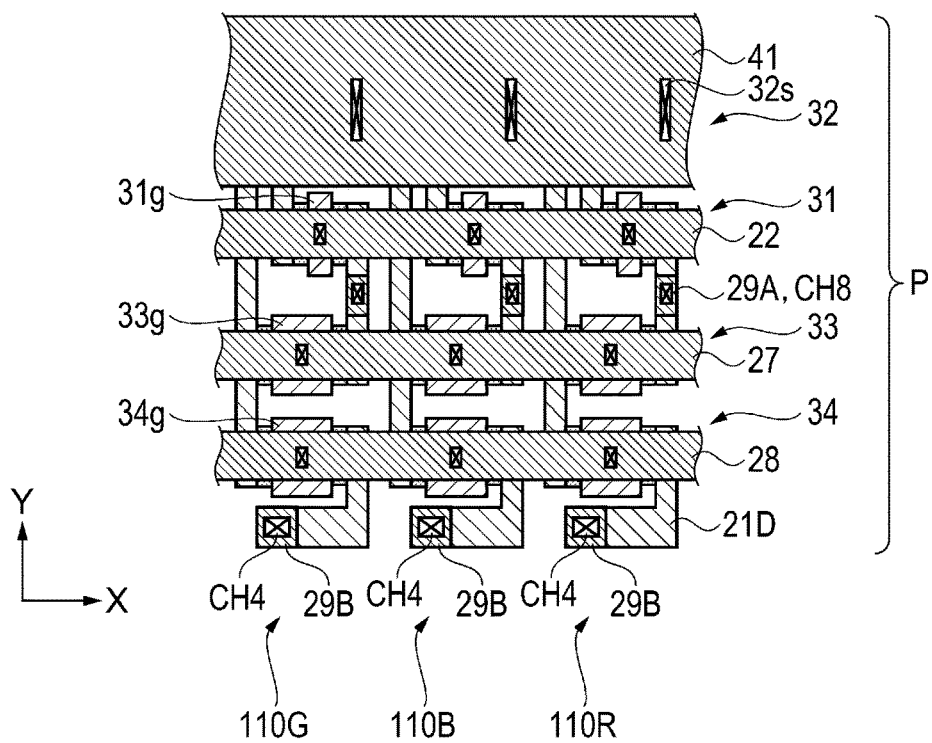
FIG. 7 is a schematic plan view illustrating an electrical arrangement configuration of pixels in a wiring layer.
Figure 8:
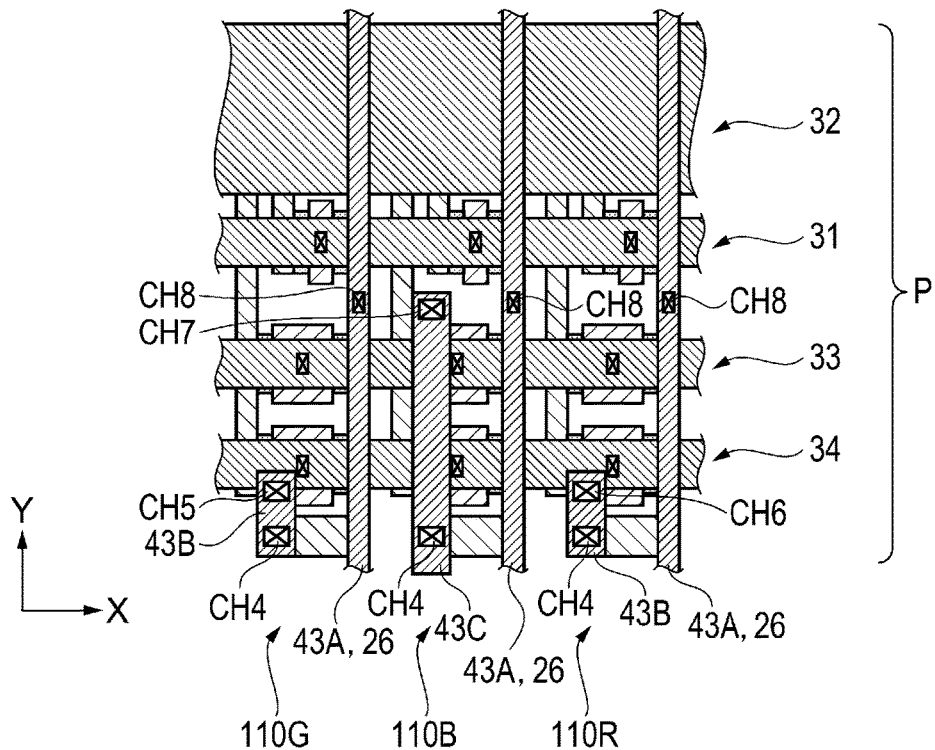
FIG. 8 is a schematic plan view illustrating an electrical arrangement configuration of pixels in a wiring layer.
Figure 9:
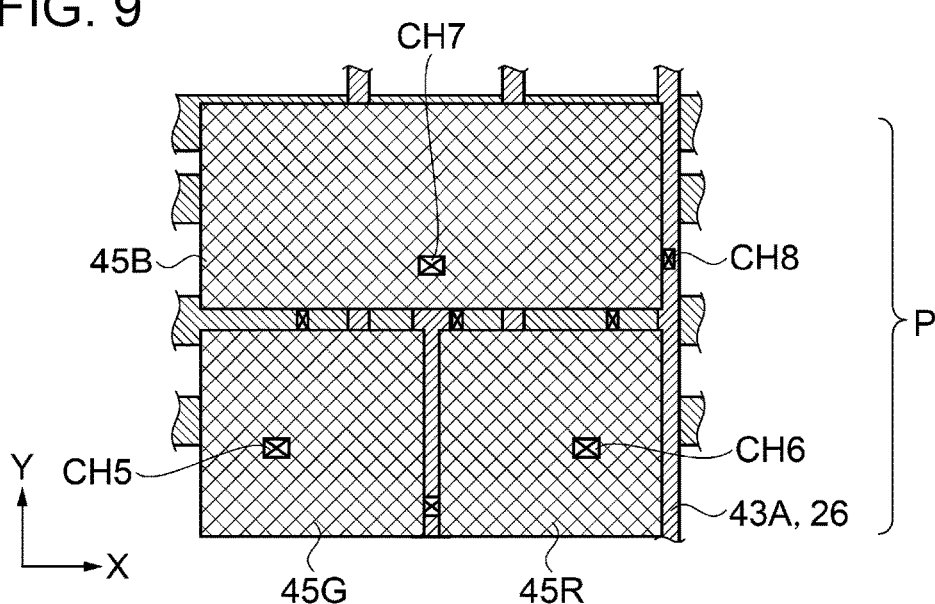
FIG. 9 is a schematic plan view illustrating an electrical arrangement configuration of pixels in a wiring layer.
Figure 10:
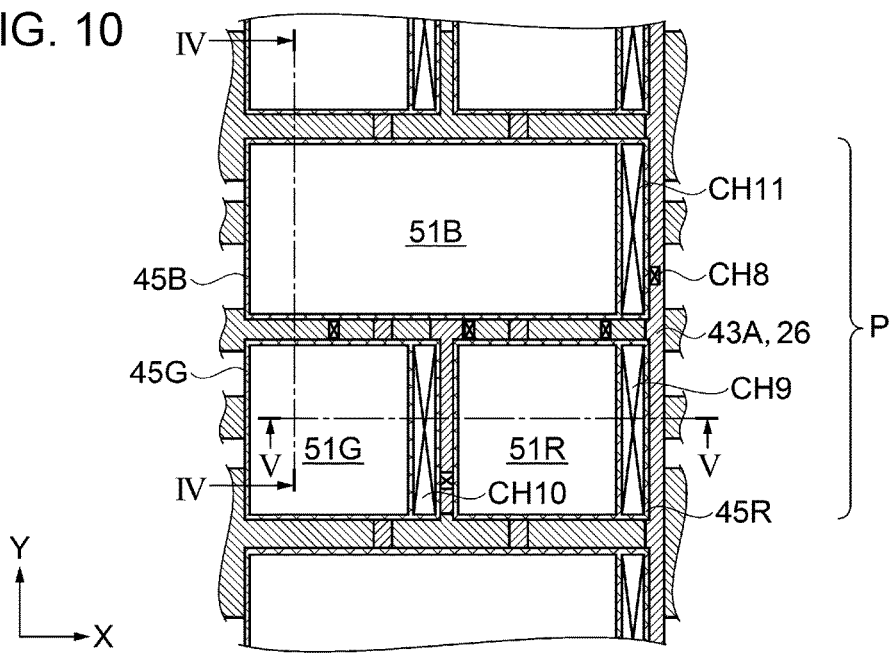
FIG. 10 is a schematic plan view illustrating an electrical arrangement configuration of pixels in a wiring layer.

Next, an electrical arrangement configuration of the pixels in each wiring layer on the semiconductor substrate 10 will be described with reference to FIGS. 6 to 10. FIGS. 6 to 10 are schematic plan views illustrating electrical arrangement configurations of the pixels in the wiring layer. Specifically, FIG. 6 illustrates an arrangement of the four transistors 31, 32, 33, and 34, FIG. 7 illustrates an arrangement of the scanning line 22, the first control line 27, the second control line 28, and the first power supply wiring 41, FIG. 8 illustrates an arrangement of the data line 26 and the relay wiring, FIG. 9 illustrates an arrangement of the reflection layers 45B, 45G, and 45R, and FIG. 10 illustrates an arrangement of the pixel electrodes 51B, 51G, and 51R and pixel contact regions.

First, the arrangement of the four transistors 31, 32, 33, and 34 and the wirings for the sources or the drains of the transistors 31, 32, 33, and 34 on the semiconductor substrate 10 will be described with reference to FIG. 6. The pixel circuit of the blue (B) sub-pixel SP is denoted by a reference numeral 110B. Similarly, the pixel circuit of the green (G) sub-pixel SP is denoted by a reference numeral 110G, and the pixel circuit of the red (R) sub-pixel SP is denoted by a reference numeral 110R.

As illustrated in FIG. 6, in the pixel P, the four transistors 31, 32, 33, and 34 included in the pixel circuit 110 are disposed such that the pair of current terminals of each of the transistors are disposed along the X direction. In addition, the light emitting control transistor 34, the compensation transistor 33, the write control transistor 31, and the driving transistor 32 are disposed in this order to be parallel to each other in the Y direction. With the arrangement of the four transistors 31, 32, 33, and 34 of the pixel circuit 110 as one unit, the pixel circuit 110G, the pixel circuit 110B, and the pixel circuit 110R are disposed in parallel in the X direction in this order.

Each of the four transistors 31, 32, 33, and 34 includes each of the gate electrodes 31g, 32g, 33g, and 34g which are disposed between the pair of current terminals so as to face the active region and are provided in an island shape. The gate electrodes 31g, 32g, 33g, and 34g are provided on the same wiring layer.

Here, one current terminal of the pair of current terminals (source and drain) of each of the transistor 31, 32, 33, and 34 is referred to as a source region, and the other current terminal is referred to as a drain region. In the write control transistor 31, the driving transistor 32, and the compensation transistor 33, the drain region of the pair of current terminals is positioned on the left side of the gate electrode in the X direction, and the source region of the pair of current terminals is positioned on the right side of the gate electrode in the X direction. On the other hand, in the light emitting control transistor 34, the drain region of the pair of current terminals is positioned on the right side of the gate electrode in the X direction, and the source region of the pair of current terminals is positioned on the left side of the gate electrode in the X direction.

The drain region 31d of the write control transistor 31 and the gate electrode 32g of the driving transistor 32 are connected to each other by the wiring 21A extending in the Y direction. The drain region 32d of the driving transistor 32, the drain region 33d of the compensation transistor 33, and the source region 34s of the light emitting control transistor 34 are connected to each other by a wiring 21B extending in the Y direction. The source region 31s of the write control transistor 31 and the source region 33s of the compensation transistor 33 are connected to each other by a wiring 21C extending in the Y direction. A contact hole 21s for connection with a relay layer 29A to be described is disposed at a midpoint of the wiring 21C extending in the Y direction. One end portion of the wiring 21D which is bent so as to extend in the X direction and the Y direction is connected to the drain region 34d of the light emitting control transistor 34, and the contact hole CH3 for connection with the relay layer 29B to be described is disposed on the other end portion of the wiring 21D. The wirings 21A, 21B, and 21C are provided on the same wiring layer above the gate electrodes 31g, 32g, 33g, and 34g.

As illustrated in FIG. 7, the scanning line 22 extends in the X direction so as to overlap with the write control transistors 31 of the pixel circuits 110G, 110B, and 110R, and is connected to the gate electrodes 31g of the write control transistors 31 via the contact holes. The first control line 27 extends in the X direction so as to overlap with the compensation transistors 33 of the pixel circuits 110G, 110B, and 110R, and is connected to the gate electrodes 33g of the compensation transistors 33 via the contact holes. The second control line 28 extends in the X direction so as to overlap with the light emitting control transistors 34 of the pixel circuits 110G, 110B, and 110R, and is connected to the gate electrodes 34g of the light emitting control transistors 34 via the contact holes. The first power supply wiring 41 extends in the X direction so as to overlap with the driving transistors 32 of the pixel circuits 110G, 110B, and 110R, and is connected to the source regions of the driving transistors 32 via the contact holes.

The relay layer 29A is provided between the scanning line 22 and the first control line 27, the relay layer 29A connecting the source region 31s of the write control transistor 31 and the contact hole 21s which is provided at the midpoint of the wiring 21C for connection with the source region 33s of the compensation transistor 33. A contact hole CH8 for connection with the data line 26 to be described is disposed on the relay layer 29A.

The relay layer 29B is provided at the other end portion of the wiring 21D connected to the drain region of the light emitting control transistor 34. The contact hole CH4 for connection with the relay wiring to be described is disposed on the relay layer 29B. That is, the contact hole CH3 below the relay layer 29B and the contact hole CH4 above the relay layer 29B are provided at the same position in plan view with the relay layer 29B interposed therebetween (refer to FIG. 4).

The scanning line 22, the first control line 27, the second control line 28, the first power supply line 41, the relay layer 29A, and the relay layer 29B are provided on the same wiring layer.

As illustrated in FIG. 8, the data line 26 extending in the Y direction is provided corresponding to each of the pixel circuits 110G, 110B, and 110R. The data line 26 is electrically connected to the wiring 21C via the contact hole CH8, the relay layer 29A, and the contact hole 21s.

In the pixel circuit 110G and the pixel circuit 110R, the relay wiring 43B extending in the Y direction is provided. One end portion of the relay wiring 43B is connected to the contact hole CH4 below the relay wiring 43B. The contact holes CH5 and CH6, which are connected to the reflection layers 45G and 45R to be described, are disposed at the other end portion of the relay wiring 43B. A relay wiring 43C extending in the Y direction is also provided in the pixel circuit 110B. The relay wiring 43C is longer than the relay wiring 43B in the Y direction, and one end portion of the relay wiring 43C is connected to the contact hole CH4 below the relay wiring 43C. A contact hole CH7, which is connected to the reflection layer 45B to be described, is disposed at the other end portion of the relay wiring 43C. The data line 26 and the relay wirings 43B and 43C are provided on the same wiring layer.

As illustrated in FIG. 9, the reflection layer 45G corresponding to the green (G) sub-pixel SP and the reflection layer 45R corresponding to the red (R) sub-pixel SP are arranged in the X direction. Each of the reflection layer 45G and the reflection layer 45R has a rectangular shape with the same size. The reflection layer 45B having the same rectangular shape is arranged in the Y direction with respect to the reflection layers 45G and 45R. The size of the reflection layer 45B is approximately twice the size of the reflection layer 45G. The reflection layers 45B, 45G, and 45R are provided in the same wiring layer, and are provided being electrically independent from each other. The reflection layer 45G is connected to the contact hole CH5 provided below the reflection layer 45G, the reflection layer 45R is connected to the contact hole CH6 provided below the reflection layer 45R, and the reflection layer 45B is connected to the contact hole CH7 provided below the reflection layer 45B.

As illustrated in FIG. 10, the pixel electrode 51B is disposed so as to overlap with the reflection layer 45B in plan view. The pixel electrode 51B has a rectangular outer shape. The contact hole CH11 for an electrical connection between the reflection layer 45B and the pixel electrode 51B is disposed so as to overlap with one end portion of the reflection layer 45B in the X direction, and is disposed so as to overlap with the short side portion of the pixel electrode 51B. The pixel electrode 51G is disposed so as to overlap with the reflection layer 45G in plan view. The pixel electrode 51G has a rectangular outer shape. The contact hole CH10 for an electrical connection between the reflection layer 45G and the pixel electrode 51G is disposed so as to overlap with one end portion of the reflection layer 45G in the X direction, and is disposed so as to overlap with the short side portion of the pixel electrode 51G. Similarly, the pixel electrode 51R is disposed so as to overlap with the reflection layer 45R in plan view. The pixel electrode 51R has a rectangular outer shape. The contact hole CH9 for an electrical connection between the reflection layer 45R and the pixel electrode 51R is disposed so as to overlap with one end portion of the reflection layer 45R in the X direction, and is disposed so as to overlap with the short side portion of the pixel electrode 51R. The region at which each of the contact holes CH9, CH10, and CH11 is provided is referred to as a pixel contact region.

The pixel electrodes 51B, 51G, and 51R, which are formed by using a transparent conductive film such as ITO, have higher resistance than the scanning line 22, the relay wiring 43B, and the like. Thus, as described above, the contact holes CH9, CH10, and CH11 for an electrical connection with the reflection layers 45B, 45G, and 45R are formed to be larger than the contact holes of other wirings in plan view.

In this manner, in the pixel circuits 110B, 110G, and 110R, except for the organic EL elements 50B, 50G, and 50R, the four transistors 31, 32, 33, and 34 and the signal wirings connected to the transistors are formed below the reflection layers 45B, 45G and 45R. The arrangement configuration in which the components are provided below the reflection layers 45B, 45G, and 45R does not affect the light emission of the organic EL elements 50B, 50G, and 50R above the reflection layers 45B, 45G, and 45R, and thus the components can have a degree of freedom in arrangement. That is, it is possible to relatively freely dispose the pixel circuit 110 according to the arrangement of the reflection layer 45 and the pixel electrode 51.

The fifth insulating layer 17, which defines the light emitting region (opening) on each of the pixel electrode 51B, 51G, and 51R, is provided so as to cover the contact holes CH9, CH10, and CH11 (refer to FIG. 5). Thus, the portions of the pixel electrodes 51B, 51G, and 51R that overlap with the contact holes CH9, CH10, and CH11 are insulated by the fifth insulating layer 17, and are not brought into contact with the light emitting function layer 53. That is, the pixel contact region is a non-light-emitting region.

In the blue (B) sub-pixel SP, the green (G) sub-pixel SP, and the red (R) sub-pixel SP, from a viewpoint of ensuring brightness, it is preferable to set the pixel contact region as the non-light-emitting region to be as small as possible. On the other hand, when the pixel contact region becomes excessively small, connection resistance between the reflection layer 45 and the pixel electrode 51 becomes small, and this causes a resistance loss in the driving current of the organic EL element 50. In addition, the arrangement of the pixel contact regions also affects optical characteristics of the pixel P. Hereinafter, a relationship between the configuration and the optical characteristics of the sub-pixel SP according to the present embodiment will be described with reference to FIGS. 11 to 13.

Arrangement of Sub-Pixel and Pixel Contact Region

Figure 11:
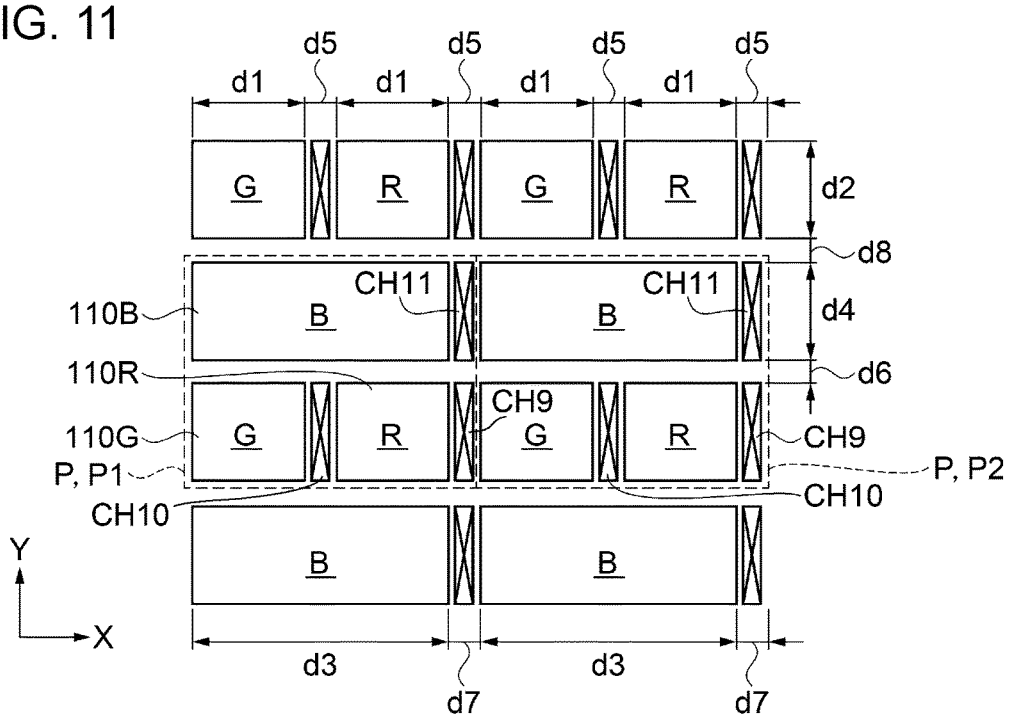
FIG. 11 is a schematic plan view illustrating an arrangement of the sub-pixels and pixel contact regions in the pixel.

FIG. 11 is a schematic plan view illustrating an arrangement of the sub-pixels and the pixel contact regions in the pixel. In the following description, for convenience of identifying each of the blue (B) sub-pixel SP, the green (G) sub-pixel SP, and the red (R) sub-pixel SP, by using the reference numerals of the pixel circuits 110B, 110G, and 110R, the blue (B) sub-pixel is denoted by the reference numeral 110B, the green (G) sub-pixel is denoted by the reference numeral 110G, and the red (R) sub-pixel is denoted by the reference numeral 110R. In addition, each of the regions illustrated in FIG. 11 that are represented as the sub-pixels 110B, 110G, and 110R indicates each of the light emitting regions. Further, it is assumed that the pixel contact regions of the sub-pixels 110B, 110G, and 110R are represented by using the reference numerals of the contact holes CH9, CH10, and CH11. That is, the pixel contact region of the sub-pixel 110R is denoted by the reference numeral CH9, the pixel contact region of the sub-pixel 110G is denoted by the reference numeral CH10, and the pixel contact region of the sub-pixel 110B is denoted by the reference numeral CH11.

As illustrated in FIG. 11, a pixel P1 as the pixel P includes the sub-pixel 110G, the pixel contact region CH10, the sub-pixel 110R, and the pixel contact region CH9 that are arranged in the X direction. The pixel P1 includes the sub-pixel 110B which is arranged in the Y direction with respect to the sub-pixel 110G and the sub-pixel 110R. The pixel contact region CH11 of the sub-pixel 110B is arranged in the X direction with respect to the sub-pixel 110B, and is arranged in the Y direction with respect to the pixel contact region CH9 of the sub-pixel 110R.

Similar to the pixel P1, a pixel P2 as the pixel P that is adjacent to the pixel P1 in the X direction includes the sub-pixel 110G, the pixel contact region CH10, the sub-pixel 110R, and the pixel contact region CH9 that are arranged in the X direction. The pixel P2 includes the sub-pixel 110B which is arranged in the Y direction with respect to the sub-pixel 110G and the sub-pixel 110R. The pixel contact region CH11 of the sub-pixel 110B is arranged in the X direction with respect to the sub-pixel 110B, and is arranged in the Y direction with respect to the pixel contact region CH9 of the sub-pixel 110R.

That is, in the pixel P1 and the pixel P2 adjacent to each other in the X direction, the sub-pixel 110G, the pixel contact region CH10, the sub-pixel 110R, and the pixel contact region CH9 are repeatedly arranged in the X direction in this order. Similarly, the sub-pixel 110B and the pixel contact region CH11 are repeatedly arranged in the X direction in this order. There is no pixel contact region between the sub-pixel 110B and the sub-pixel 110G and the sub-pixel 110R that are arranged in the Y direction. The pixel contact region is a non-light-emitting region as described above. In addition, as described with reference to FIGS. 4 and 5, since the opening is defined as the light emitting region by the fifth insulating layer 17 which forms the opening on each of the pixel electrodes 51B, 51G, and 51R, each of the sub-pixels 110B, 110G, and 110R illustrated in FIG. 11 is surrounded by the non-light-emitting regions.

In the present embodiment, in the pixel P1, the sub-pixel 110G is an example of a first sub-pixel according to the invention, and the sub-pixel 110R is an example of a second sub-pixel according to the invention. In addition, in the pixel P2 adjacent to the pixel P1 in the X direction, the sub-pixel 110G is an example of a third sub-pixel according to the invention, and the sub-pixel 110R is an example of a fourth sub-pixel according to the invention. In addition, in the sub-pixels 110B of the pixel P1 and the pixel P2 adjacent to each other in the X direction, the sub-pixel 110B of the pixel P1 is an example of a fifth sub-pixel according to the invention, and the sub-pixel 110B of the pixel P2 is an example of a sixth sub-pixel according to the invention. Thus, in the pixel P1, the pixel contact region CH10 is an example of a first region according to the invention, and the pixel contact region CH9 is an example of a second region according to the invention. In the pixel P2, the pixel contact region CH10 is an example of a third region according to the invention, and the pixel contact region CH9 is an example of a fourth region according to the invention. In addition, the pixel contact region CH11 of the pixel P1 is an example of a fifth region, and the pixel contact region CH11 of the pixel P2 is an example of a sixth region.

Here, it is assumed that a length of the light emitting region of the sub-pixel 110G and a length of the light emitting region of the sub-pixel 110R in the X direction are the same width d1, and that a length of the light emitting region of the sub-pixel 110G and a length of the light emitting region of the sub-pixel 110R in the Y direction are the same width d2. It is assumed that a length of the light emitting region of the sub-pixel 110B in the X direction is a width d3, and that a length of the light emitting region of the sub-pixel 110B in the Y direction is a width d4. The width d2 and the width d4 may be the same length or different lengths. It is assumed that a length of the pixel contact region CH9 and a length of the pixel contact region CH10 in the X direction are the same distance d5, and that a length of the pixel contact region CH11 in the X direction is a distance d7. Although the distance d5 and the distance d7 are the same length in this case, the distances d5 and d7 may be different lengths. It is assumed that lengths of the pixel contact regions CH9 and CH10 in the Y direction and lengths of the light emitting regions of the sub-pixels 110G and 110R in the Y direction are the same width d2. It is assumed that a length of the pixel contact region CH11 in the Y direction and a length of the light emitting region of the sub-pixel 110B in the Y direction are the same width d4. It is assumed that a length between the sub-pixel 110B and the sub-pixels 110G and 110R in the pixel P that are adjacent to each other in the Y direction is a distance d6, and that a length between the sub-pixel 110B of the pixel P and the sub-pixels 110G and 110R of the pixel P that are adjacent to the sub-pixel 110B in the Y direction is a distance d8. The distances d6 and d8 may be the same length or different lengths.

That is, in the present embodiment, the pixels P1 and P2 adjacent to each other in the X direction as the first direction include the sub-pixel 110G as the first sub-pixel, the pixel contact region CH10 as the first region, the sub-pixel 110R as the second sub-pixel, the pixel contact region CH9 as the second region, the sub-pixel 110G as the third sub-pixel, the pixel contact region CH10 as the third region, the sub-pixel 110R as the fourth sub-pixel, and the pixel contact region CH9 as the fourth region that are arranged in the X direction. The sub-pixel 110G and the sub-pixel 110R have colors different from each other. The lengths of the pixel contact regions CH9 and CH10 of the pixel P1 and the pixel P2 in the X direction as the first direction are the same distance d5.

In addition, the pixels P1 and P2 further include the sub-pixel 110B as the fifth sub-pixel, the pixel contact region CH11 as the fifth region, the sub-pixel 110B as the sixth sub-pixel, and the pixel contact region CH11 as the sixth region that are arranged in the X direction as the first direction. The sub-pixel 110B is arranged in the Y direction as the second direction with respect to the sub-pixel 110G and the sub-pixel 110R, and the lengths of the pixel contact regions CH11 of the pixel P1 and the pixel P2 are the same distance d7.

In the present embodiment, the distance d6, which is a length between the sub-pixel 110B and the sub-pixels 110G and 110R in the pixel P, is an example of a seventh region and a eighth region of the invention. In addition, the pixel contact region CH11 of the sub-pixel 110B is an example of a ninth region according to the invention. The sub-pixel 110B is also treated as a third sub-pixel in another application example according to the invention.

In the present embodiment, an area of the sub-pixel 110G is the same as an area of the sub-pixel 110R. In addition, an area of the sub-pixel 110B is twice the area of the sub-pixel 110G. This is because a light emitting lifetime of the organic EL element 50B of the sub-pixel 110B is shorter than a light emitting lifetime of the organic EL element 50G of the sub-pixel 110G (or the organic EL element 50R of the sub-pixel 110R). The light emitting brightness depends on an amount of current flowing through the organic EL element 50 and a light emitting area, and the light emitting lifetime depends on the amount of current flowing through the organic EL element 50 and a conduction time. Therefore, by increasing the area of the sub-pixel 110B as compared with the area of the sub-pixel 110G and decreasing the amount of current while ensuring the light emitting brightness, the light emitting lifetime of the organic EL element 50B can be substantially equal to the light emitting lifetime of the organic EL element 50G.

The feature of the arrangement of the sub-pixels SPs and the pixel contact regions according to the present embodiment is that the sub-pixel 110G, the pixel contact region CH10, the sub-pixel 110R, and the pixel contact region CH9 are repeatedly disposed in the X direction in this order, and that the length of the pixel contact region CH9 is the same as the length of the pixel contact region CH10. Thereby, the sub-pixel 110G and the sub-pixel 110R with different colors are disposed at an equal interval in the X direction.

In addition, when the distances d6 and d8 in the Y direction are the same length, in the pixels P adjacent in the Y direction, the sub-pixel 110G and the sub-pixel 110B with different colors are disposed at an equal interval in the Y direction. Similarly, the sub-pixel 110R and the sub-pixel 110B with different colors are disposed at an equal interval in the Y direction.

Figure 12:
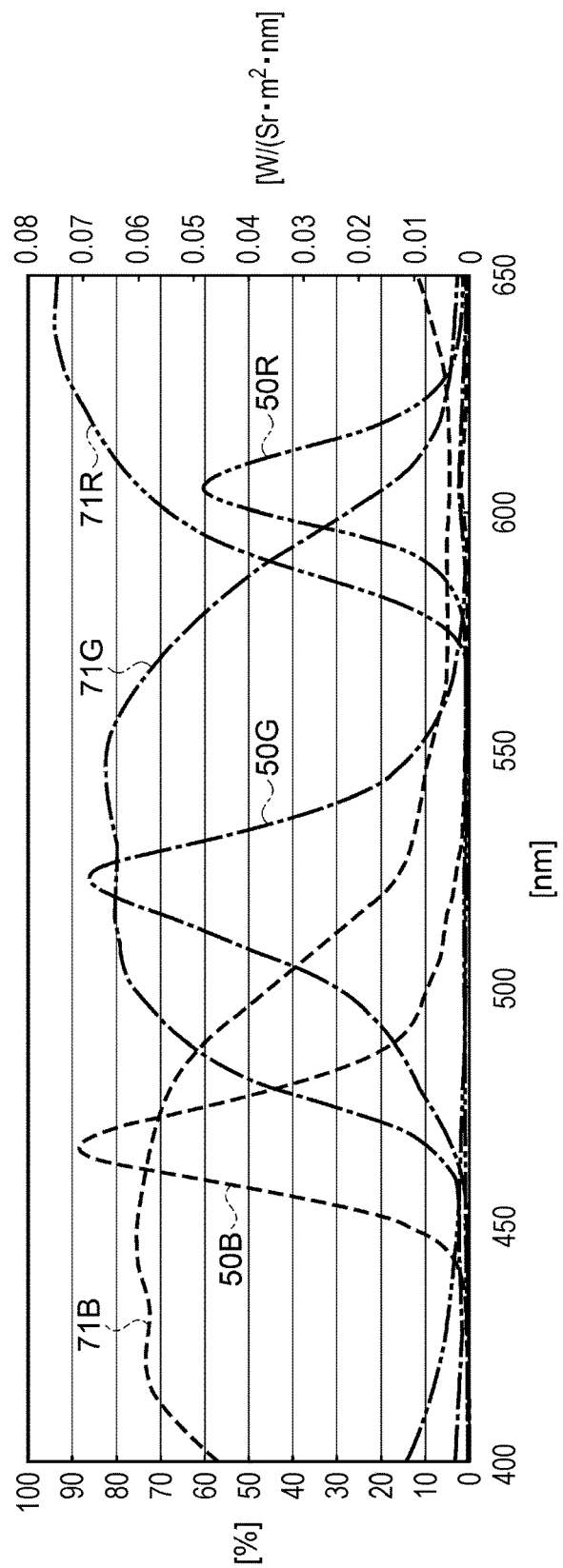
FIG. 12 is a graph illustrating spectral characteristics of a resonance structure and spectral characteristics of a color filter in each of the blue (B) sub-pixel, the green (G) sub-pixel, and the red (R) sub-pixel.

FIG. 12 is a graph illustrating spectral characteristics of the resonance structure and spectral characteristics of the color filter in each of the blue (B) sub-pixel SP, the green (G) sub-pixel SP, and the red (R) sub-pixel SP.

As described above, in order to obtain colored light in a desired wavelength range from each of the blue (B) sub-pixel SP, the green (G) sub-pixel SP, and the red (R) sub-pixel SP, the resonance structure of the organic EL elements 50B, 50G, and 50R and the colored layers 71B, 71G, and 71R are provided.

As illustrated in FIG. 12, the blue (B) colored layer 71B has a light transmittance of 60% or more in a wavelength range of, for example, 400 nm to 490 nm. In a wavelength range of 490 nm or more, the light transmittance decreases, and in a wavelength range of 550 nm or more, the light transmittance becomes 10% or less. The green (G) colored layer 71G has a light transmittance of 60% or more in a wavelength range of, for example, 490 nm to 580 nm. In a wavelength range of less than 490 nm, the light transmittance sharply decreases, and in a wavelength range of less than 460 nm, the light transmittance becomes less than 5%. In addition, in a wavelength range of 580 nm or more, the light transmittance gradually decreases, and in a wavelength range of 620 nm or more, the light transmittance becomes 5% or less. The red (R) colored layer 71R has a light transmittance of 60% or more in a wavelength range of, for example, 590 nm to 650 nm. In a wavelength range of less than 590 nm, the light transmittance sharply decreases, and in a wavelength range of 410 nm or more and 570 nm or less, the light transmittance becomes 10% or less. In other words, the spectral characteristics of the colored layer 71B and the spectral characteristics of the colored layer 71G have overlapped portions, and the light transmittance of the colored layer 71B and the light transmittance of the colored layer 71G are approximately 60% in the vicinity of 490 nm. In addition, the spectral characteristics of the colored layer 71G and the spectral characteristics of the colored layer 71R have overlapped portions, and the light transmittance of the colored layer 71G and the light transmittance of the colored layer 71R are approximately 45% in the vicinity of 590 nm.

On the other hand, from the organic EL element 50B of the blue (B) sub-pixel SP, light having a resonance wavelength of, for example, approximately 460 nm at which a peak occurs in spectral radiation brightness (unit: W (watt)/Sr (steradian)·m$^2$ (square meter)–nm (nanometer)), is emitted. From the organic EL element 50G of the green (G) sub-pixel SP, light having a resonance wavelength of, for example, approximately 520 nm at which a peak occurs in the spectral radiation brightness, is emitted. From the organic EL element 50R of the red (R) sub-pixel SP, light having a resonance wavelength of, for example, approximately 610 nm at which a peak occurs in the spectral radiation brightness, is emitted. In other words, by providing the resonance structure and the color filter 70 (colored layers 71B, 71G, and 71R), color light with high color purity can be obtained from each of the blue (B), green (G), and red (R) sub-pixels SPs.

Figure 13:
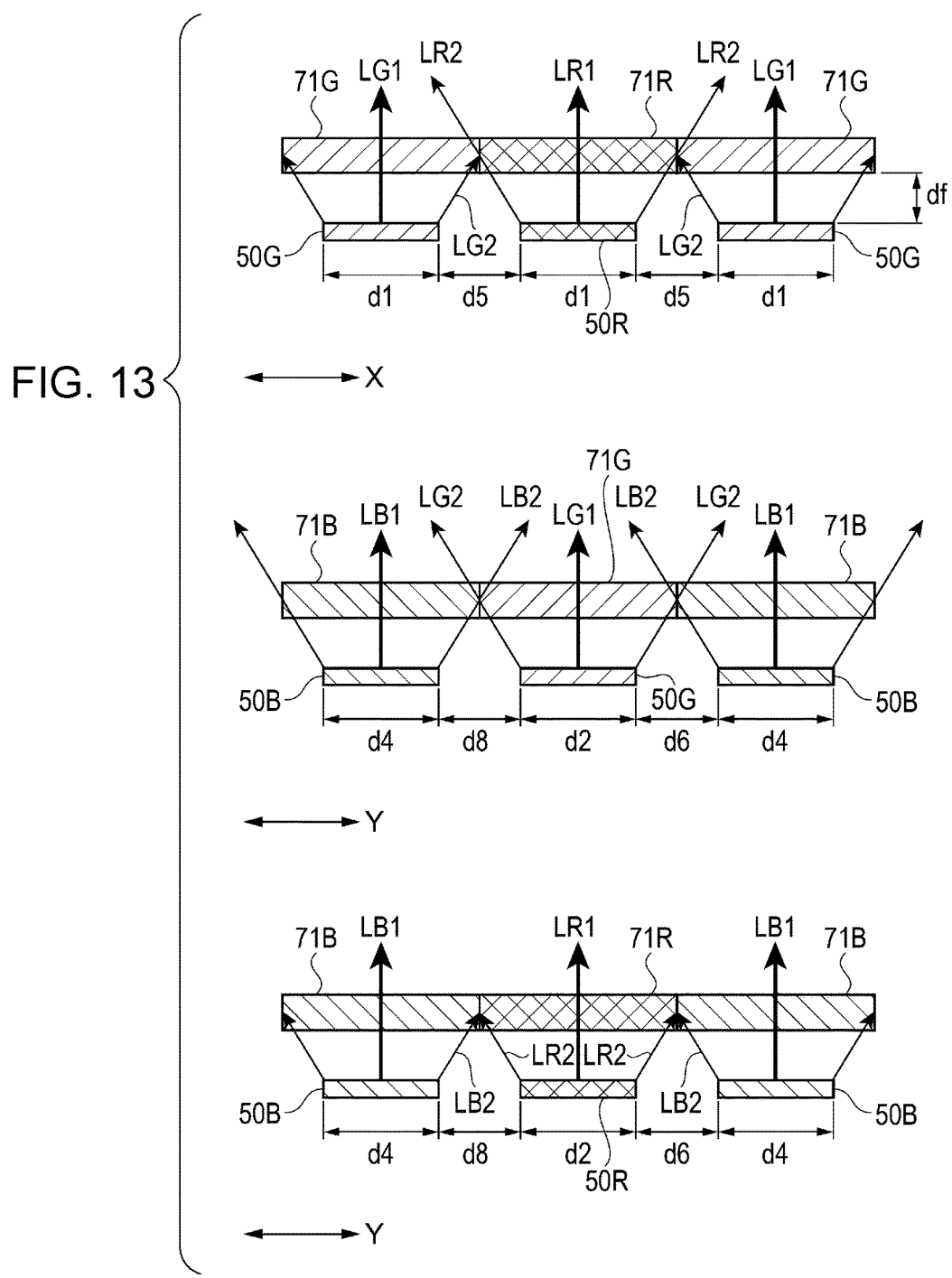
FIG. 13 is a schematic diagram for explaining color deviation which is caused by viewing angle in a case where the sub-pixels with different colors are adjacent to each other in an X direction or a Y direction.

FIG. 13 is a schematic diagram for explaining color deviation which is caused by viewing angle in a case where the sub-pixels with different colors are adjacent to each other in the X direction or the Y direction. Specifically, in FIG. 13, the sub-pixels SPs disposed in the order of green (G), red (R), and green (G) in the X direction are illustrated in an upper stage, the sub-pixels SPs disposed in the order of blue (B), green (G), and blue (B) in the Y direction are illustrated in a middle stage, and the sub-pixels SPs disposed in the order of blue (B), red (R), and blue (B) in the Y direction are illustrated in a lower stage.

As illustrated in the upper stage of FIG. 13, light LG1 emitted from the organic EL element 50G of the green (G) sub-pixel SP in the normal direction transmits through the colored layer 71G, and is emitted. Similarly, light LR1 emitted from the organic EL element 50R of the red (R) sub-pixel SP in the normal direction transmits through the colored layer 71R, and is emitted. Light LG2 emitted obliquely from the organic EL element 50G toward the colored layer 71R cannot transmit through the colored layer 71R as illustrated by the spectral characteristics of the colored layer 71R illustrated in FIG. 12 (most of the light LG2 is absorbed by the colored layer 71R). On the other hand, as illustrated in FIG. 12, since the spectral characteristics of the colored layer 71G and the spectral characteristics of the organic EL element 50R have overlapped portions, a part of the light LR2 emitted obliquely from the organic EL element 50R toward the colored layer 71G transmits through the colored layer 71G. That is, as illustrated in an upper stage of FIG. 13, when observing the green (G) sub-pixel SP (colored layer 71G) from an oblique direction with respect to the X direction, a color mixing state where a part of the light LR2 is mixed with the light LG1 is visually recognized. For example, when one end in the X direction of the light emitting region of the red (R) organic EL element 50R is disposed to be closer to the green (G) colored layer 71G, an amount of the light LR2 which obliquely transmits through the colored layer 71G increases. Thus, visibility of a color mixing state changes.

In the present embodiment, the pixel contact region between the light emitting region of the organic EL element 50G and the light emitting region of the organic EL element 50R has the same distance d5 in the X direction. Therefore, in a case of observing the green (G) sub-pixel SP from the left side and the right side in the X direction, a color mixing state is unlikely to be changed. That is, the color deviation which is caused by the viewing angle in the X direction is reduced. When considering reduction of the color deviation which is caused by the viewing angle in the X direction, as illustrated in FIG. 5, preferably, the colored layer 71G and the colored layer 71R with different colors are disposed such that a boundary between the colored layers 71G and 71R in the X direction is positioned at the center of the distance d5, which is the length of the pixel contact region in the X direction that is defined by the fifth insulating layer 17. In other words, preferably, a distance from an end portion of the light emitting region of the organic EL element 50R to an end portion of the colored layer 71R is the same on the left side and the right side in the X direction in the drawing, the light emitting region being illustrated by the width d1 in the X direction. Similarly, preferably, a distance from an end portion of the light emitting region of the organic EL element 50G to an end portion of the colored layer 71G is the same on the left side and the right side in the X direction in the drawing, the light emitting region being illustrated by the width d1 in the X direction.

As illustrated in the upper stage of FIG. 13, a distance df between the light emitting portions of the organic EL elements 50B, 50G, and 50R and the color filter 70 (colored layers 71B, 71G, and 71R) is determined depending on a film thickness of the sealing layer 60 as illustrated in FIG. 4 or FIG. 5. The film thickness of the sealing layer 60 is approximately 2 μm to 4 μm. Compared with a case where the organic EL elements 50B, 50G, and 50R and the color filter 70 (colored layers 71B, 71G, and 71R) are formed on separate substrates and the separate substrates are disposed so as to face each other, since the color filter 70 is formed on the sealing layer 60, it is possible to form the color filter 70 (colored layers 71B, 71G, and 71R) with high position accuracy with respect to the light emitting portions of the organic EL elements 50B, 50G, and 50R. In addition, since the light emitting portions of the organic EL elements 50B, 50G, and 50R and the color filter 70 (colored layers 71B, 71G, and 71R) can be disposed to be closer to each other, it is possible to suppress an influence of the color deviation which is caused by the viewing angle.

As illustrated in the middle stage of FIG. 13, light LG1 emitted from the organic EL element 50G of the green (G) sub-pixel SP in the normal direction transmits through the colored layer 71G, and is emitted. Similarly, light LB1 emitted from the organic EL element 50B of the blue (B) sub-pixel SP in the normal direction transmits through the colored layer 71B, and is emitted. As illustrated in FIG. 12, since the spectral characteristics of the colored layer 71B and the spectral characteristics of the organic EL element 50G have overlapped portions, a part of the light LG2 emitted obliquely from the organic EL element 50G toward the colored layer 71B transmits through the colored layer 71B. In addition, as illustrated in FIG. 12, since the spectral characteristics of the colored layer 71G and the spectral characteristics of the organic EL element 50B have overlapped portions, a part of the light LB2 emitted obliquely from the organic EL element 50B toward the colored layer 71G transmits through the colored layer 71G. That is, as illustrated in the middle stage of FIG. 13, when observing the green (G) sub-pixel SP (colored layer 71G) from an oblique direction with respect to the Y direction, color mixing in which a part of the light LB2 is mixed with the light LG1 and color mixing in which a part of the light LG2 is mixed with the light LB1 are visually recognized. For example, when one end in the Y direction of the light emitting region of the blue (B) organic EL element 50B is disposed to be closer to the green (G) colored layer 71G, an amount of the light LB2 which transmits through the colored layer 71G increases. Thus, visibility of a color mixing state changes. From a viewpoint of reducing the color deviation which is caused by the viewing angle in the Y direction, preferably, a distance d6 of one pixel contact region between the light emitting region of the organic EL element 50G and the light emitting region of the organic EL element 50B, and a distance d8 of the other pixel contact region have the same length in the Y direction. When considering reduction of the color deviation which is caused by the viewing angle in the Y direction, as illustrated in FIG. 4, preferably, the colored layer 71B and the colored layer 71G with different colors are disposed such that a boundary between the colored layers 71B and 71G in the Y direction is positioned at the center of the distance d6 (distance d8), which is the length of the region between the sub-pixels in the Y direction that is defined by the fifth insulating layer 17. In other words, preferably, a distance from an end portion of the light emitting region of the organic EL element 50G to an end portion of the colored layer 71G is the same on the left side and the right side in the Y direction in the drawing, the light emitting region being illustrated by the width d2 in the Y direction. Similarly, preferably, a distance from an end portion of the light emitting region of the organic EL element 50B to an end portion of the colored layer 71B is the same on the left side and the right side in the Y direction in the drawing, the light emitting region being illustrated by the width d4 in the Y direction.

Comparing the color mixing in which a part of the light LR2 is mixed with the light LG1 and the color mixing in which a part of the light LB2 is mixed with the light LG1 as illustrated in the upper stage of FIG. 13, the light LB2 has lower visibility than the light LR2. Therefore, the color mixing in the X direction in which a part of the light LR2 is mixed with the light LG1 may be emphasized, and the color mixing in the Y direction in which a part of the light LB2 is mixed with the light LG1 may be neglected. In other words, the distance d6 of one pixel contact region between the light emitting region of the organic EL element 50G and the light emitting region of the organic EL element 50B, and the distance d8 of the other pixel contact region may not necessarily have the same length in the Y direction.

As illustrated in the lower stage of FIG. 13, the light LR1 emitted from the organic EL element 50R of the red (R) sub-pixel SP in the normal direction transmits through the colored layer 71R, and is emitted. Similarly, the light LB1 emitted from the organic EL element 50B of the blue (B) sub-pixel SP in the normal direction transmits through the colored layer 71B, and is emitted. As illustrated in FIG. 12, since the spectral characteristics of the colored layer 71B and the spectral characteristics of the organic EL element 50R hardly overlap with each other, a part of the light LR2 emitted obliquely from the organic EL element 50R toward the colored layer 71B does not transmit through the colored layer 71B. In addition, as illustrated in FIG. 12, since the spectral characteristics of the colored layer 71R and the spectral characteristics of the organic EL element 50B hardly overlap with each other, a part of the light LB2 emitted obliquely from the organic EL element 50B toward the colored layer 71R does not transmit through the colored layer 71R. That is, when observing the sub-pixels from an oblique direction with respect to the Y direction, the color mixing in which the light LB2 is mixed with the light LR1 and the color mixing in which the light LR2 is mixed with the light LB1 are not visually recognized. That is, even when the distance d6 or the distance d8 between the light emitting region of the organic EL element 50B and the light emitting region of the organic EL element 50R is decreased in the Y direction, the color mixing is unlikely to occur.

Effects according to the first embodiment are as follows.

(1) In the pixel P1 and the pixel P2 adjacent to each other in the X direction, the sub-pixel 110G, the pixel contact region CH10, the sub-pixel 110R, and the pixel contact region CH9 are repeatedly disposed in the X direction in this order. The pixel contact region CH9 and the pixel contact region CH10 have the same distance d5 in the X direction. Therefore, since the light emitting regions of the sub-pixels 110G and 110R with different colors are disposed at an equal interval in the X direction, it is possible to provide the electrooptical device 100 capable of reducing the color deviation which is caused by the viewing angle in the X direction.

(2) In the pixel P1 and the pixel P2 adjacent to each other in the X direction, the sub-pixel 110B is arranged in the Y direction with respect to the sub-pixels 110G and 110R. In addition, the sub-pixel 110B and the pixel contact region CH11 are repeatedly disposed in the X direction in this order. The distance d7 in the X direction of the pixel contact region CH11 has the same length as the distance d5 in the X direction of the pixel contact region CH9. That is, the light emitting regions of the sub-pixels 110B, 110G, and 110R are disposed in the X direction at an equal interval by the pixel contact regions CH9, CH10, and CH11. In other words, it is possible to partition the light emitting regions of the sub-pixels 110B, 110G, and 110R in the X direction at an equal interval by the pixel contact regions CH9, CH10, and CH11, without using a special configuration for partitioning each of the sub-pixels 110B, 110G, and 110R in the X direction at an equal interval.

(3) Each of the sub-pixels 110B, 110G, and 110R includes the organic EL element 50, the resonance structure of the organic EL element 50, and the color filter 70 (colored layers 71B, 71G, and 71R), it is possible to obtain color light with excellent color purity from each of the sub-pixels 110B, 110G, and 110R. Therefore, it is possible to provide a self-emission type electrooptical device 100 capable of reducing the color deviation which is caused by the viewing angle in the X direction and performing color display with excellent visibility.

(4) The organic EL element 50 (organic EL elements 50B, 50G, and 50R), the resonance structure of the organic EL elements 50B, 50G, and 50R, and the color filter 70 (colored layers 71B, 71G, and 71R) are formed on the same semiconductor substrate 10. Although the sealing layer 60 is provided between the organic EL element 50 and the color filter 70, since the light emitting portion of the organic EL element 50 and the color filter 70 can be disposed to be close to each other as compared with a case where the organic EL element 50 and the color filter 70 are formed on separate substrates, it is possible to provide the self-emission type electrooptical device 100 in which the color deviation caused by the viewing angle hardly affects display quality.

Hereinafter, embodiments in which the arrangement of the sub-pixels SPs with different colors is changed will be described. In each of the following embodiments, the basic configuration of the electrooptical device 100 is the same, and the sub-pixel SP includes the organic EL element 50 as a light emitting element, the resonance structure of the organic EL element 50, and the color filter 70. Therefore, the same reference numerals are given to the same components as those of the first embodiment, and a detailed description thereof will be omitted. In addition, in each of the following embodiments, the effects (3) and (4) according to the first embodiment are exhibited in common.

Second Embodiment

Figure 14:
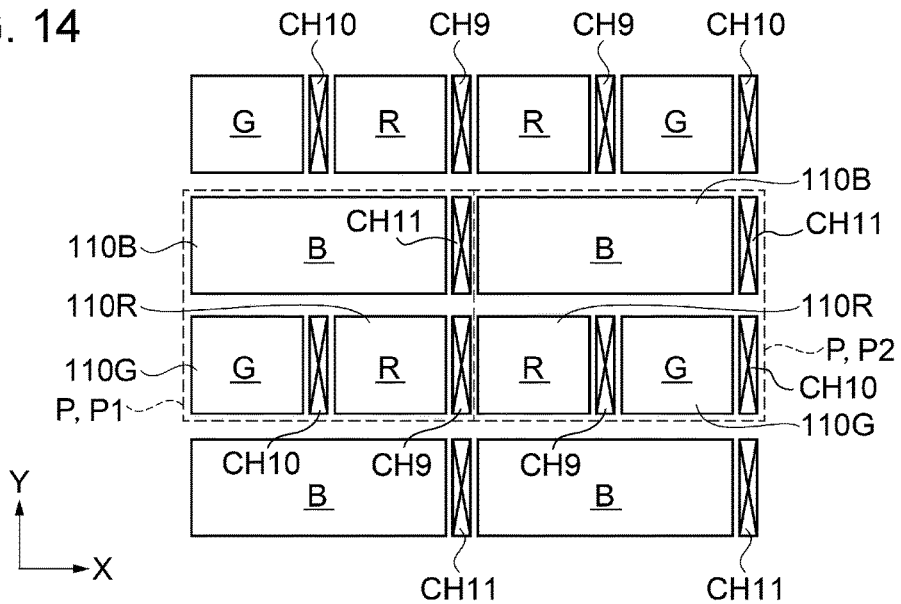
FIG. 14 is a schematic plan view illustrating an arrangement of the sub-pixels and the pixel contact regions in the electrooptical device according to a second embodiment.

FIG. 14 is a schematic plan view illustrating an arrangement of the sub-pixels and the pixel contact regions in the electrooptical device according to a second embodiment.

As illustrated in FIG. 14, in the second embodiment, in the pixel P1 and the pixel P2 adjacent to each other in the X direction, the arrangement in the X direction of the sub-pixel 110G and the sub-pixel 110R is made different from that of the first embodiment. More specifically, the sub-pixel 110G, the pixel contact region CH10, the sub-pixel 110R, the pixel contact region CH9, the sub-pixel 110R, the pixel contact region CH9, the sub-pixel 110G, and the pixel contact region CH10 are disposed in the X direction in this order. The sub-pixels 110R with the same color are disposed in the X direction with the pixel contact region CH9 interposed therebetween, and the sub-pixels 110G with the same color are disposed in the X direction with the pixel contact region CH10 interposed therebetween. In the pixel P1 and the pixel P2 adjacent to each other in the X direction, the sub-pixel 110R, the pixel contact region CH9, the sub-pixel 110G, the pixel contact region CH10, the sub-pixel 110G, the pixel contact region CH10, the sub-pixel 110R, and the pixel contact region CH9 may be disposed in the X direction in this order. Each of the sub-pixels 110B, 110G, and 110R illustrated in FIG. 14 indicates each of the light emitting regions thereof.

The arrangement of the sub-pixel 110B and the pixel contact region CH11 is the same as in the first embodiment, and the sub-pixel 110B is arranged in the Y direction with respect to the sub-pixel 110G and the sub-pixel 110R. In the pixel P1 and the pixel P2 adjacent to each other in the X direction, the sub-pixel 110B and the pixel contact region CH11 are repeatedly disposed in the X direction in this order. That is, the sub-pixels 110B with the same color are disposed in the X direction with the pixel contact region CH11 interposed therebetween.

According to the arrangement of the sub-pixels SPs, the sub-pixels SPs with the same color are arranged in the X direction with the pixel contact region of the corresponding sub-pixel SP that is interposed therebetween.

In the X direction, the length of the light emitting region of the sub-pixel 110G is the same as the length of the light emitting region of the sub-pixel 110R, and the length of the pixel contact region CH9 and the length of the pixel contact region CH10 are also the same. In addition, in the X direction, the length of the pixel contact region CH9 and the length of the pixel contact region CH11 are also the same.

According to the second embodiment, in addition to the effects (2) to (4) according to the first embodiment, the following effects can be obtained.

(5) The sub-pixels SPs with the same color are disposed in the X direction with the pixel contact region of the corresponding sub-pixel SP that is interposed therebetween. That is, in the pixel P1 and the pixel P2 adjacent to each other in the X direction, the sub-pixels SPs with different colors are disposed in line symmetry with the pixel contact regions CH9 and CH11 as a reference. Therefore, as compared with the first embodiment, color symmetry in the arrangement of the sub-pixels SP in the X direction is realized, and a probability that the sub-pixels SPs with different colors are disposed to be adjacent to each other in the X direction decreases. Thus, it is possible to further suppress the color deviation which is caused by the viewing angle in the X direction.

Third Embodiment

Figure 15:
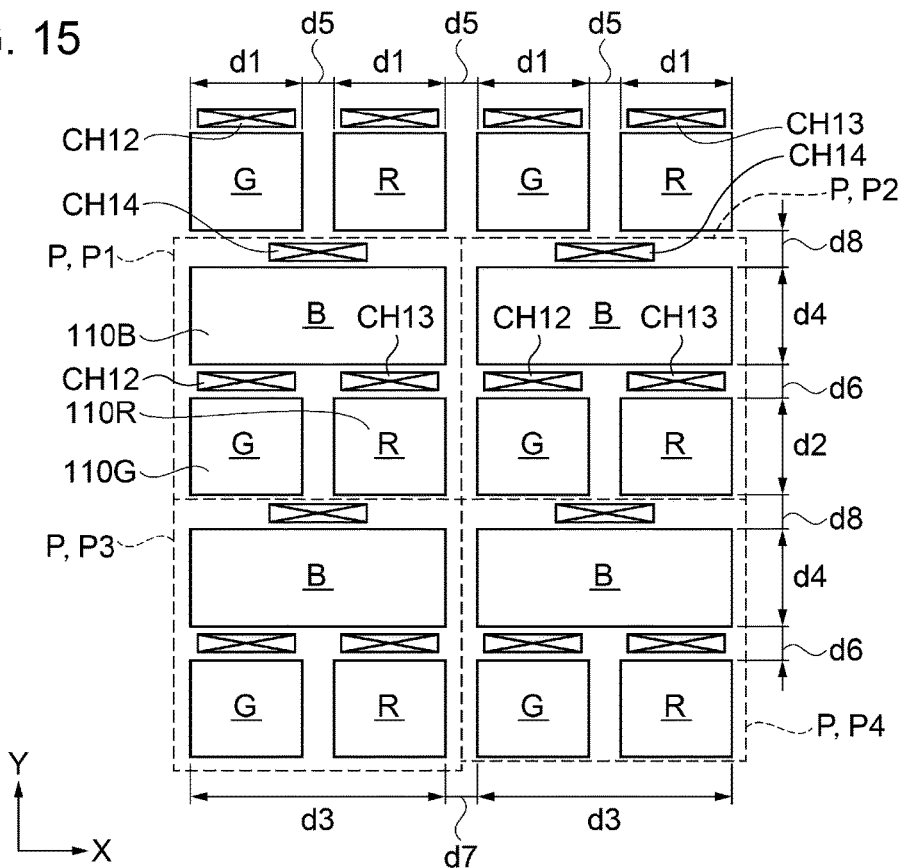
FIG. 15 is a schematic plan view illustrating an arrangement of the sub-pixels and the pixel contact regions in the electrooptical device according to a third embodiment.

FIG. 15 is a schematic plan view illustrating an arrangement of the sub-pixels and the pixel contact regions in the electrooptical device according to a third embodiment.

As illustrated in FIG. 15, the third embodiment is different from the first embodiment in the arrangement of the pixel contact regions. Specifically, the sub-pixel 110G and the sub-pixel 110R are disposed in this order to be parallel to each other with a distance d5 in the X direction. The sub-pixel 110B is repeatedly disposed with a distance d7 in the X direction. Each of the sub-pixels 110B, 110G, and 110R illustrated in FIG. 15 indicates each of the light emitting regions thereof.

The light emitting regions of the sub-pixel 110G and the sub-pixel 110R have a width d1 in the X direction, and the light emitting region of the sub-pixel 110B has a width d3 in the X direction that is wider than the width d1. The light emitting regions of the sub-pixel 110G and the sub-pixel 110R have a width d2 in the Y direction, and the light emitting region of the sub-pixel 110B has a width d4 in the Y direction. The width d2 and the width d4 in the Y direction may be the same or different from each other.

In the pixel P, the sub-pixels 110B is arranged in the Y direction with respect to the sub-pixel 110G and the sub-pixel 110R. In the pixel P, the pixel contact region CH12 of the sub-pixel 110G and the pixel contact region CH13 of the sub-pixel 110R are provided in a region between the sub-pixel 110G and the sub-pixel 110R and the sub-pixel 110B which are arranged in the Y direction, that is, in the distance d6. In addition, in the pixel P1 and the pixel P3 as pixels P adjacent to each other in the Y direction, the pixel contact region CH14 of the sub-pixel 110B is provided in a region between the sub-pixel 110G and the sub-pixel 110R and the sub-pixel 110B which are arranged in the Y direction, that is, in the distance d8. In this case, the distance d6 and the distance d8 have the same length in the Y direction.

In the present embodiment, in the pixel P1, the sub-pixel 110G is an example of a first sub-pixel according to the invention, and the sub-pixel 110R is an example of a second sub-pixel according to the invention. In addition, in the pixel P2 adjacent to the pixel P1 in the X direction, the sub-pixel 110G is an example of a third sub-pixel according to the invention, and the sub-pixel 110R is an example of a fourth sub-pixel according to the invention. In addition, in the pixel P1 and the pixel P3 adjacent to each other in the Y direction, the sub-pixel 110B which is arranged in the Y direction with respect to the sub-pixel 110G and the sub-pixel 110R is an example of the fifth sub-pixel according to the invention. In addition, in the pixel P2 and the pixel P4 adjacent to each other in the Y direction, the sub-pixel 110B which is arranged in the Y direction with respect to the sub-pixel 110G and the sub-pixel 110R is an example of the sixth sub-pixel according to the invention. Therefore, a region (distance d6) in which the pixel contact region CH12 and the pixel contact region CH13 are provided in the pixel P1 is an example of a fifth region according to the invention, and a region (distance d8) in which the pixel contact region CH14 is provided in the pixel P3 is an example of a sixth region according to the invention. A region (distance d6) in which the pixel contact region CH12 and the pixel contact region CH13 are provided in the pixel P2 is an example of a seventh region according to the invention, and a region (distance d8) in which the pixel contact region CH14 is provided in the pixel P4 is an example of an eighth region according to the invention. In addition, in the pixel P1, a region between the sub-pixel 110G and the sub-pixel 110R which are adjacent to each other in the X direction is an example of a first region, in the pixel P1 and the pixel P2 adjacent to each other in the X direction, a region between the sub-pixel 110R and the sub-pixel 110G is an example of a second region according to the invention, and in the pixel P2, a region between the sub-pixel 110G and the sub-pixel 110R which are adjacent to each other in the X direction is an example of a third region according to the invention. In the pixel P2, a region between the sub-pixels, which is arranged in the X direction with respect to the sub-pixel 110R and to be opposite to the third region, is an example of a fourth region according to the invention.

According to the third embodiment, in addition to the effects (3) and (4) according to the first embodiment, the following effects can be obtained.

(6) In the pixel P1 and the pixel P3 adjacent to each other in the Y direction, the sub-pixel 110G, the pixel contact region CH12, the sub-pixel 110B, the pixel contact region CH14, the sub-pixel 110G, the pixel contact region CH12, the sub-pixel 110B, and the pixel contact region CH14 are disposed in the Y direction in this order. Similarly, the sub-pixel 110R, the pixel contact region CH13, the sub-pixel 110B, the pixel contact region CH14, the sub-pixel 110R, the pixel contact region CH13, the sub-pixel 110B, and the pixel contact region CH14 are disposed in the Y direction in this order. Since the distance d6 in the Y direction of the pixel contact regions CH12 and CH13 and the distance d8 in the Y direction of the pixel contact region CH14 are the same, as described in the first embodiment, according to the spectral characteristics illustrated in FIG. 12, the light emitting region of the sub-pixel 110B and the light emitting region of the sub-pixel 110G are disposed in the Y direction at an equal interval, the sub-pixel 110B and the sub-pixel 110G being sub-pixels with different colors in which color mixing occurs. In addition, the light emitting region of the sub-pixel 110B and the light emitting region of the sub-pixel 110R are disposed in the Y direction at an equal interval, the sub-pixel 110B and the sub-pixel 110R being sub-pixels with different colors in which color mixing is unlikely to occur. That is, it is possible to provide an electrooptical device capable of reducing the color deviation which is caused by the viewing angle in the Y direction.

As in the first embodiment, from the viewpoint of reducing the color deviation which is caused by the viewing angle in the X direction, preferably, the distance d5 of the arrangement of the sub-pixel 110G and the sub-pixel 110R and the distance d7 of the arrangement of the sub-pixels 110B have the same length.

Fourth Embodiment

Figure 16:
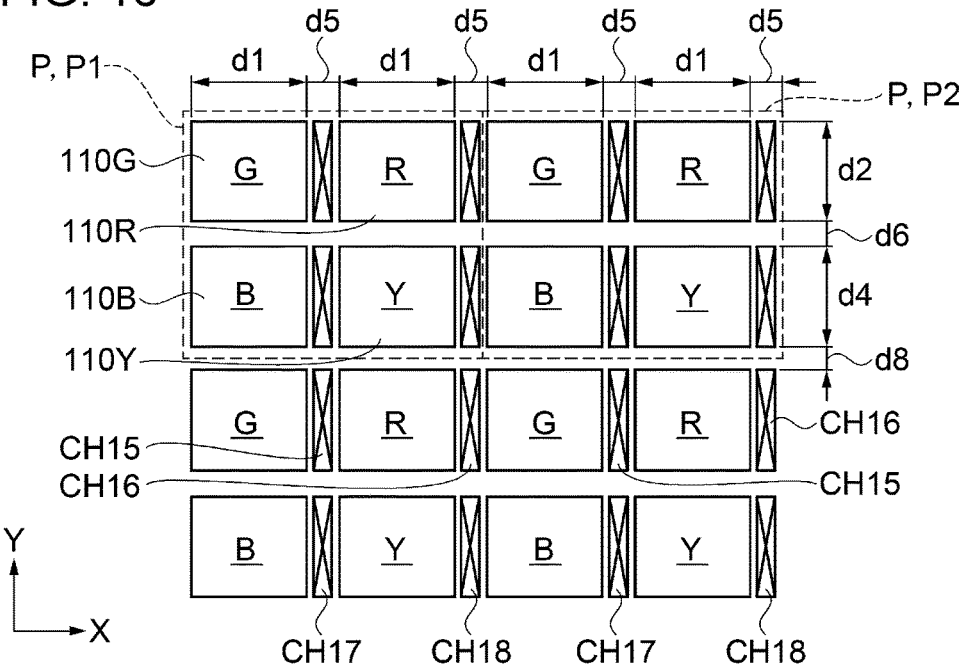
FIG. 16 is a schematic plan view illustrating an arrangement of the sub-pixels and the pixel contact regions in the electrooptical device according to a fourth embodiment.

FIG. 16 is a schematic plan view illustrating an arrangement of the sub-pixels and the pixel contact regions in the electrooptical device according to a fourth embodiment.

As illustrated in FIG. 16, the fourth embodiment is different from the first embodiment in that the number of the sub-pixels SPs with different colors in the pixel P as a display unit is increased from three colors to four colors. In addition, each of the sub-pixels 110B, 110G, 110R, and 110Y illustrated in FIG. 16 indicates each of the light emitting regions thereof.

Specifically, In the pixel P, the sub-pixel 110G, the pixel contact region CH15, the sub-pixel 110R, and the pixel contact region CH16 are disposed in this order to be parallel to each other in the X direction. In addition, the sub-pixel 110B, the pixel contact region CH17, the yellow (Y) sub-pixel 110Y, and the pixel contact region CH18 are disposed in this order to be parallel to each other in the X direction. The sub-pixel 110G are arranged in the Y direction with respect to the sub-pixel 110B, and the sub-pixels 110R are arranged in the Y direction with respect to the sub-pixel 110Y. The color to be increased other than blue (B), green (G), and red (R) is not limited to yellow (Y), and other intermediate colors may be selected.

The light emitting regions of the sub-pixel 110G, the sub-pixel 110R, the sub-pixel 110B, and the sub-pixel 110Y have the same width d1 in the X direction. The light emitting regions of the sub-pixel 110G and the sub-pixel 110R have a width d2 in the Y direction, and the light emitting regions of the sub-pixel 110B and the sub-pixel 110Y have a width d4 in the Y direction. The width d2 and the width d4 may be the same or different from each other.

The pixel contact regions CH15, CH16, CH17, and CH18 have the same distance d5 in the X direction.

In the pixel P, the length between the sub-pixel 110B and the sub-pixel 110G and the length between the sub-pixel 110Y and the sub-pixel 110R in the Y direction have the same distance d6. That is, in the pixel P, the length between the light emitting regions of the sub-pixels SPs with different colors in the Y direction is the distance d6. In this manner, in the pixels P adjacent to each other in the Y direction, the length between the light emitting regions of the sub-pixels SPs with different colors is the distance d8. The distance d6 and the distance d8 in the Y direction may have the same length or different lengths from each other.

That is, in the present embodiment, in the pixel P1 and the pixel P2 as the pixels P adjacent to each other in the X direction, the light emitting regions of the sub-pixels SP with four different colors are disposed in the X direction at an equal interval. In addition, the sub-pixel 110G according to the present embodiment is an example of a first sub-pixel according to another application example of the invention, similarly, the sub-pixel 110R is an example of a second sub-pixel, the sub-pixel 110B is an example of a third sub-pixel, and the sub-pixel 110Y is an example of a fourth sub-pixel.

According to the fourth embodiment, in addition to the effects (3) and (4) according to the first embodiment, the following effects can be obtained.

(7) In the pixel P1 and the pixel P2 as the pixels P adjacent to each other in the X direction, the light emitting regions of the sub-pixels SP with four different colors are disposed in the X direction at an equal interval. Therefore, it is possible to provide an electrooptical device with more excellent color expression by reducing the color deviation which is caused by the viewing angle in the X direction and increasing the number of the yellow (Y) sub-pixels 110Y.

As in the third embodiment, from the viewpoint of reducing the color deviation which is caused by the viewing angle in the Y direction, it is preferable to set the distance d6 of the arrangement of the light emitting region of the sub-pixel 110G and the light emitting region of the sub-pixel 110B in the pixel P and the distance d8 of the arrangement of the light emitting region of the sub-pixel 110B and the light emitting region of the sub-pixel 110G in the pixels P adjacent to each other in the Y direction to be the same.

Fifth Embodiment

Figure 17:
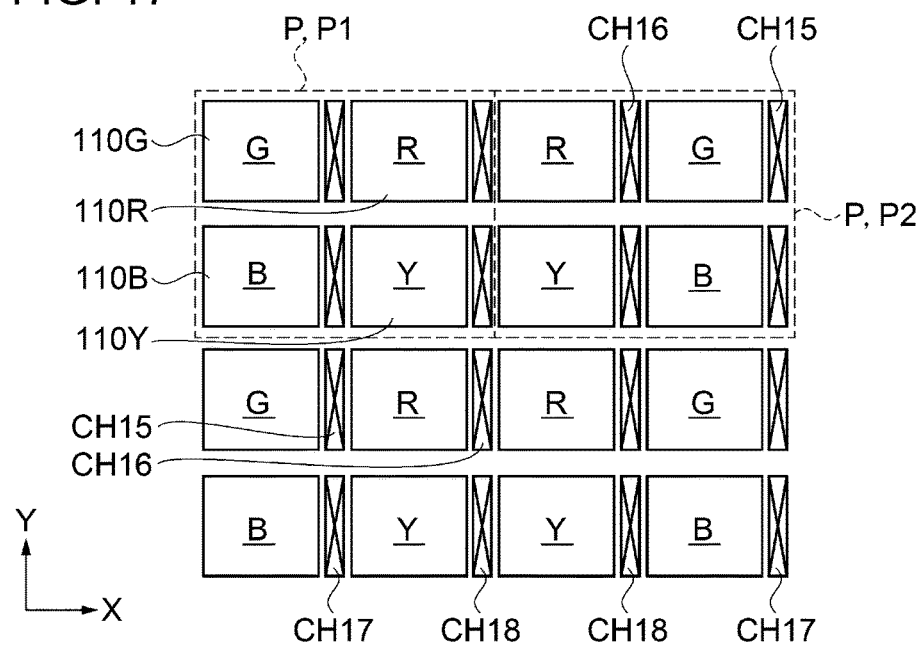
FIG. 17 is a schematic plan view illustrating an arrangement of the sub-pixels and the pixel contact regions in the electrooptical device according to a fifth embodiment.

FIG. 17 is a schematic plan view illustrating an arrangement of the sub-pixels and the pixel contact regions in the electrooptical device according to a fifth embodiment.

As illustrated in FIG. 17, the fifth embodiment is the same as the fourth embodiment in that the number of the sub-pixels SPs with different colors in the pixel P as a display unit is increased from three colors to four colors, and is different from the fourth embodiment in that the arrangement of the sub-pixels SPs with different colors is changed. In addition, each of the sub-pixels 110B, 110G, 110R, and 110Y illustrated in FIG. 17 indicates each of the light emitting regions thereof.

Specifically, in the pixel P1 and the pixel P2 adjacent to each other in the X direction, the sub-pixel 110G, the pixel contact region CH15, the sub-pixel 110R, the pixel contact region CH16, the sub-pixel 110R, the pixel contact region CH16, the sub-pixel 110G, and the pixel contact region CH15 are disposed in this order to be parallel to each other in the X direction. In addition, the sub-pixel 110B, the pixel contact region CH17, the sub-pixel 110Y, the pixel contact region CH18, the sub-pixel 110Y, the pixel contact region CH18, the sub-pixel 110B, and the pixel contact region CH17 are disposed in this order to be parallel to each other in the X direction. The sub-pixels 110G are arranged in the Y direction with respect to the sub-pixel 110B, and the sub-pixels 110R are arranged in the Y direction with respect to the sub-pixel 110Y.

In the present embodiment, in the pixel P1 and the pixel P2 adjacent to each other in the X direction, the sub-pixels 110R with the same color are disposed with the pixel contact region CH16 interposed therebetween. Similarly, the sub-pixels 110Y with the same color are disposed with the pixel contact region CH18 interposed therebetween. That is, in the pixels Ps adjacent to each other in the X direction, the sub-pixels SPs with the same color are disposed with the pixel contact region of the corresponding sub-pixel that is interposed therebetween.

According to the fifth embodiment, in addition to the effects (3) and (4) according to the first embodiment, the following effects can be obtained.

(8) The sub-pixels SPs with the same color are disposed in the X direction with the pixel contact region of the corresponding sub-pixel SP that is interposed therebetween. That is, in the pixel P1 and the pixel P2 adjacent to each other in the X direction, the sub-pixels SPs with different colors are disposed in line symmetry with the pixel contact regions CH16 and CH18 as a reference. Therefore, as compared with the fourth embodiment, color symmetry in the arrangement of the light emitting regions of the sub-pixels SP in the X direction is realized, and a probability that the sub-pixels SPs with different colors are disposed to be adjacent to each other in the X direction decreases. Thus, it is possible to further suppress the color deviation which is caused by the viewing angle in the X direction.

Next, the effects according to examples that can reduce the color deviation which is caused by the viewing angle will be described based on specific examples and comparative examples relating to a size and an arrangement of the light emitting regions of the sub-pixels SPs with different colors.

Example 1

The arrangement of the sub-pixels SPs with different colors according to example 1 is the same as that of the first embodiment illustrated in FIG. 11, and dimensions related to each sub-pixel SP are as follows.

The width d1 of the light emitting regions of the sub-pixel 110G and the sub-pixel 110R in the X direction is 2.5 μm.

The width d2 of the light emitting regions of the sub-pixel 110G and the sub-pixel 110R in the Y direction is 3.4 μm.

The width d3 of the light emitting region of the sub-pixel 110B in the X direction is 6.25 μm.

The width d4 of the light emitting region of the sub-pixel 110B in the Y direction is 2.7 μm.

The distance d5 (distance d7) of the pixel contact regions CH9, CH10, and CH11 in the X direction is 1.25 μm.

The distance d6 and the distance d8 between the light emitting regions of the sub-pixel 110G and the sub-pixel 110R and the light emitting region of the sub-pixel 110B in the Y direction are the same, and are 0.7 μm.

Example 2

The arrangement of the sub-pixels SPs with different colors according to example 2 is the same as that of the third embodiment illustrated in FIG. 15, and dimensions related to each sub-pixel SP are as follows.

The width d1 of the light emitting regions of the sub-pixel 110G and the sub-pixel 110R in the X direction is 3.05 μm.

The width d2 of the light emitting regions of the sub-pixel 110G and the sub-pixel 110R in the Y direction is 2.65 μm.

The width d3 of the light emitting region of the sub-pixel 110B in the X direction is 6.8 μm.

The width d4 of the light emitting region of the sub-pixel 110B in the Y direction is 2.35 μm.

The distance d5, which is a length in the X direction of the region between the light emitting regions of the sub-pixel 110G and the sub-pixel 110R adjacent to each other in the X direction, is 0.7 μm. Similarly, the distance d7, which is a length in the X direction of the region between the light emitting regions of the sub-pixels 110B adjacent to each other in the X direction, is 0.7 μm.

The distance d6 (distance d8), which is a length in the Y direction of the pixel contact regions CH12, CH13, and CH14, is 1.25 μm.

Comparative Example 1

Figure 18:
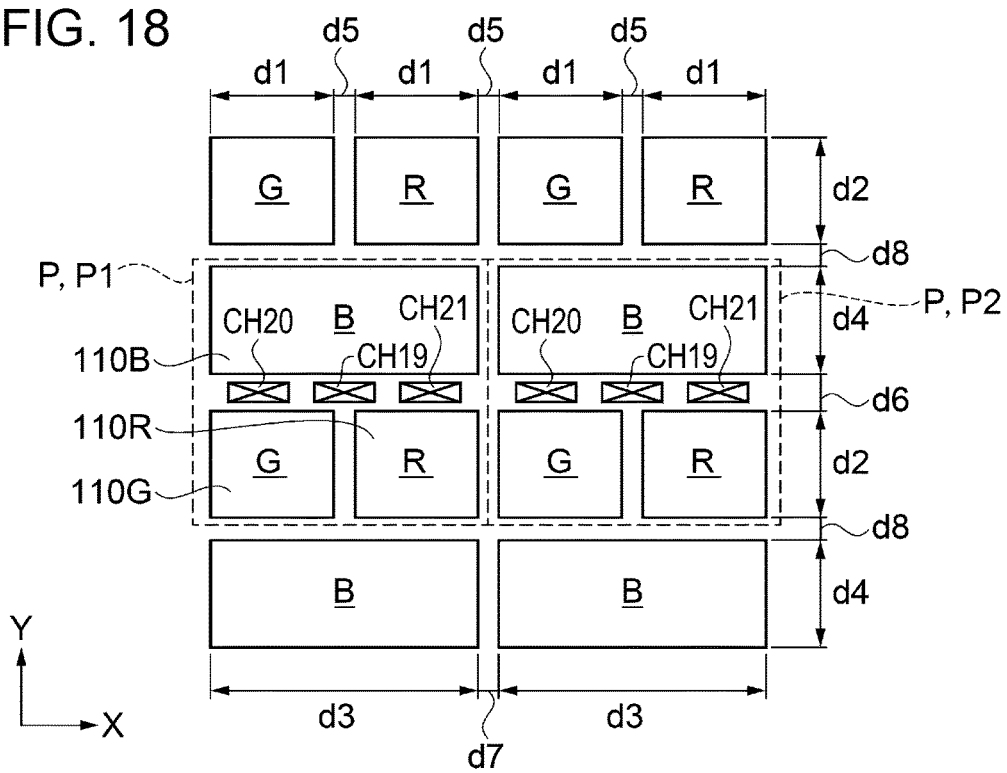
FIG. 18 is a schematic plan view illustrating an arrangement of the sub-pixels with different colors and the pixel contact regions according to a comparative example 1.

FIG. 18 is a schematic plan view illustrating an arrangement of the sub-pixels SPs with different colors and the pixel contact regions according to a comparative example 1. Each of the sub-pixels 110B, 110G, and 110R illustrated in FIG. 18 indicates each of the light emitting regions thereof. As illustrated in FIG. 18, in comparative example 1, in the pixel P as a display unit, the sub-pixel 110G and the sub-pixel 110R are arranged in the X direction, and the sub-pixel 110B is arranged in the Y direction with respect to the sub-pixel 110G and the sub-pixel 110R. In consideration of only the arrangement of the sub-pixels SPs with different colors, although the arrangement according to comparative example 1 is the same as that according to the first embodiment, the three contact holes CH19, CH20, and CH21 of the sub-pixel 110B, the sub-pixel 110G, and the sub-pixel 110R are disposed in a region between the sub-pixel 110G and the sub-pixel 110R and the sub pixel 110B which are arranged in the Y direction. That is, the length in the Y direction of the pixel contact regions CH19, CH20, and CH21 is the distance d6.

Dimensions of each sub-pixel SP according to comparative example 1 are as follows.

The width d1 of the light emitting regions of the sub-pixel 110G and the sub-pixel 110R in the X direction is 3.05 μm.

The width d2 of the light emitting regions of the sub-pixel 110G and the sub-pixel 110R in the Y direction is 2.9 μm.

The width d3 of the light emitting region of the sub-pixel 110B in the X direction is 6.8 μm.

The width d4 of the light emitting region of the sub-pixel 110B in the Y direction is 2.65 μm.

The distance d5, which is a length in the X direction of the region between the light emitting regions of the sub-pixel 110G and the sub-pixel 110R adjacent to each other in the X direction, is 0.7 μm. Similarly, the distance d7, which is a length in the X direction of the region between the light emitting regions of the sub-pixels 110B adjacent to each other in the X direction, is 0.7 μm.

The distance d6, which is a length in the Y direction of the pixel contact regions CH19, CH20, and CH21, is 1.25 μm. In addition, a length in the Y direction of a region between the sub-pixel 110G and the sub-pixel 110R and the sub-pixel 110B arranged in the Y direction without the contact holes CH19, CH20, and CH21, that is, the distance d8 is 0.7 μm.

Comparative Example 2

Figure 19:
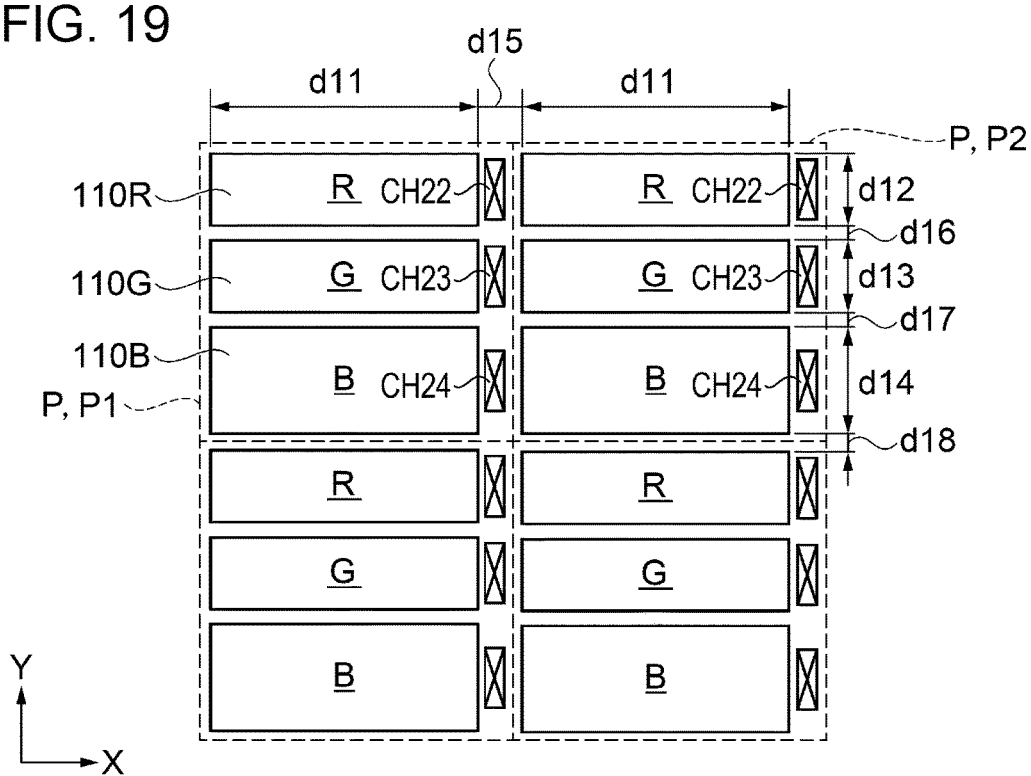
FIG. 19 is a schematic plan view illustrating an arrangement of the sub-pixels with different colors and the pixel contact regions according to a comparative example 2.

FIG. 19 is a schematic plan view illustrating an arrangement of the sub-pixels with different colors and the pixel contact regions according to a comparative example 2. Each of the sub-pixels 110B, 110G, and 110R illustrated in FIG. 19 indicates each of the light emitting regions thereof. As illustrated in FIG. 19, in comparative example 2, in the pixel P as a display unit, the sub-pixel 110B, the sub-pixel 110G, and the sub-pixel 110R are disposed in this order to be parallel to each other in the Y direction. In the pixel P1 and the pixel P2 adjacent to each other in the X direction, the sub-pixel 110B and the pixel contact region CH24 are disposed in this order to be parallel to each other in the X direction, the sub-pixel 110G and the pixel contact region CH23 are disposed in this order to be parallel to each other in the X direction, and the sub-pixel 110R and the pixel contact region CH22 are disposed in this order to be parallel to each other in the X direction. The arrangement of the sub-pixels SPs with different colors is called as a horizontal stripe method.

Dimensions of each sub-pixel SP according to comparative example 2 are as follows.

The width d11 in the X direction of each of the light emitting regions of the sub-pixel 110B, the sub-pixel 110G, and the sub-pixel 110R is 6.25 μm.

The width d12 of the light emitting region of the sub-pixel 110R in the Y direction is 1.37 μm.

The width d13 of the light emitting region of the sub-pixel 110G in the Y direction is the same as the width d12, and is 1.37 μm.

The width d14 of the light emitting region of the sub-pixel 110B in the Y direction is 2.66 μm.

The distance d15 of the pixel contact regions CH22, CH23, and CH24 in the X direction is 1.25 μm.

The distances d16, d17, and d18 between the sub-pixels SPs with different colors in the Y direction are all the same, and are 0.7 μm.

In the example 1, the example 2, the comparative example 1, and the comparative example 2, it is assumed that the size of the pixel P as a display unit is the same, that a light emitting area of the sub-pixel 110G and a light emitting area of the sub-pixel 110R are same, and that a light emitting area of the sub-pixel 110B is approximately twice that of the sub-pixel 110G.

Evaluation of Optical Characteristics in Examples and Comparative Examples

Figure 20:
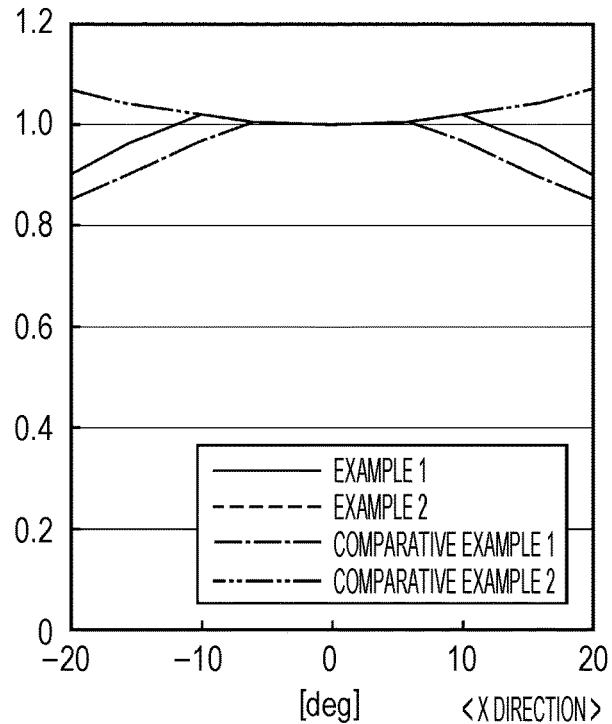
FIG. 20 is a graph illustrating viewing angle characteristics of brightness in the X direction according to examples and comparative examples.
Figure 21:
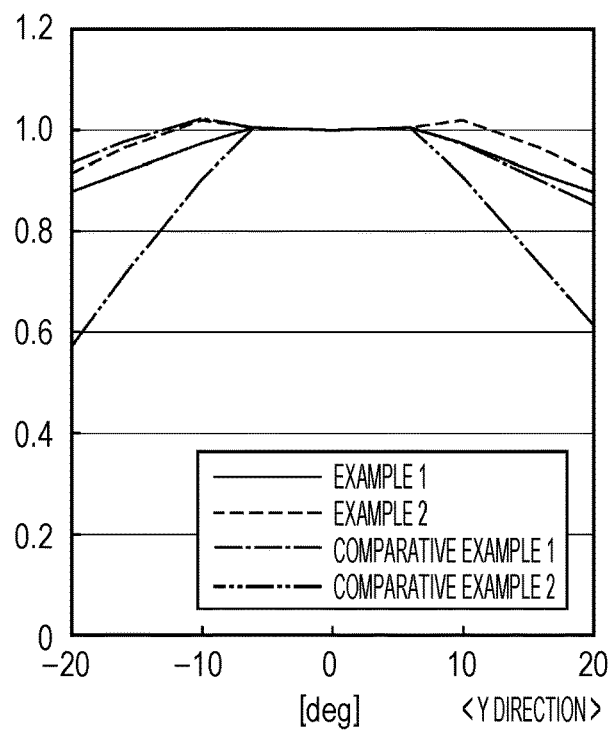
FIG. 21 is a graph illustrating viewing angle characteristics of brightness in the Y direction according to the examples and the comparative examples.
Figure 22:
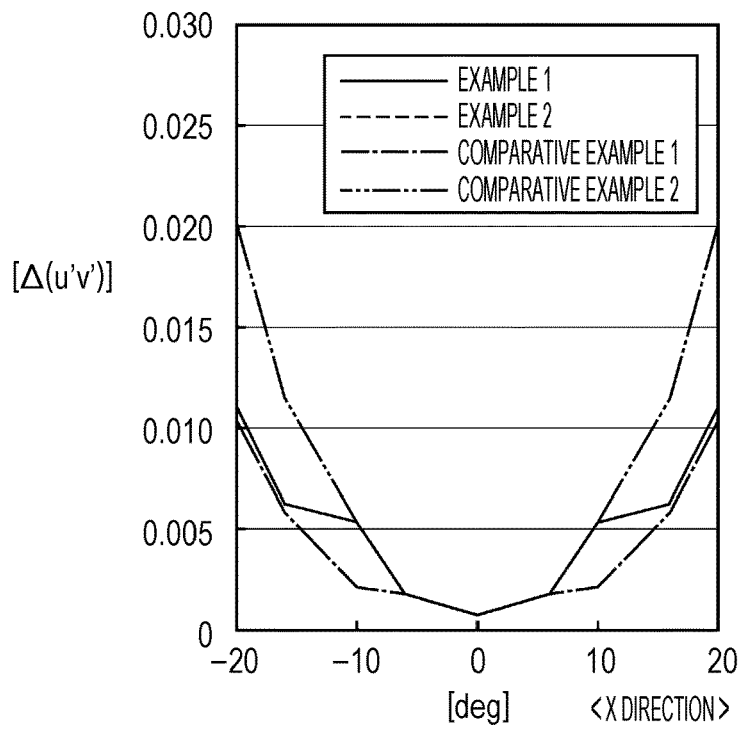
FIG. 22 is a graph illustrating viewing angle characteristics of color deviation in the X direction according to the examples and the comparative examples.
Figure 23:
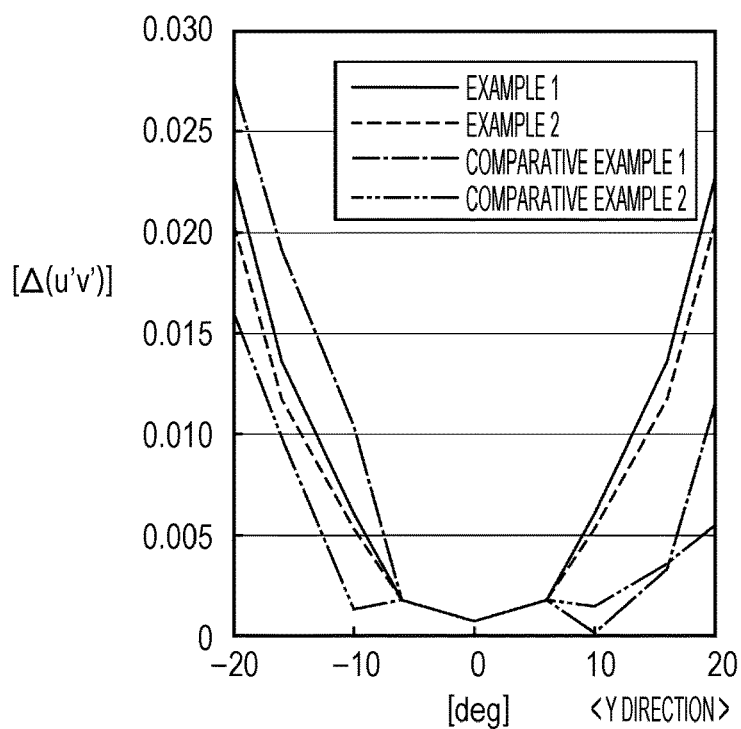
FIG. 23 is a graph illustrating viewing angle characteristics of color deviation in the Y direction according to the examples and the comparative examples.

FIG. 20 is a graph illustrating viewing angle characteristics of the brightness in the X direction according to the examples and the comparative examples, FIG. 21 is a graph illustrating viewing angle characteristics of the brightness in the Y direction according to the examples and the comparative examples, FIG. 22 is a graph illustrating viewing angle characteristics of the color deviation in the X direction according to the examples and the comparative examples, and FIG. 23 is a graph illustrating viewing angle characteristics of the color deviation in the Y direction according to the examples and the comparative examples.

As a method of evaluating the optical characteristics, the viewing angle characteristics of the brightness and the viewing angle characteristics of the color deviation in a state where all of the pixels P in the display region 101a of the display panel 101 are in a white display state, are obtained by using an optical simulator. The brightness is obtained by calculating a brightness value with respect to front brightness "1" when changing the viewing angle with respect to the normal direction within a range of ±20 degrees. The color deviation is obtained by calculating a chromaticity deviation amount (Δu'v') with respect to front chromaticity in a white display state (according to CIE 1976 UCS chromaticity diagram) when changing the viewing angle with respect to the normal direction within a range of ±20 degrees.

In the electrooptical devices according to the examples and the comparative examples, the configuration and the arrangement of the pixel P (sub-pixels SPs) are set on a premise that the electrooptical device is used for a display portion of a head mount display as an electronic apparatus to be described. Therefore, in evaluation of the examples and the comparative examples, the electrooptical device is evaluated as a preferable electrooptical device when a change in brightness is within 20% with respect to the front brightness and when the color deviation (Δu'v') is 0.02 or less, in a viewing angle range of ±15 degrees.

As illustrated in FIG. 20, in the viewing angle characteristics of the brightness in the X direction, in each of the example 1, the example 2, the comparative example 1, and the comparative example 2, a change in brightness is within 20%. The viewing angle characteristic of the brightness according to the example 2 is almost the same as the viewing angle characteristic of the brightness according to the comparative example 1, and is represented as the comparative example 1 in FIG. 20. On the other hand, in the viewing angle characteristics of the brightness in the Y direction, as illustrated in FIG. 21, in the example 1, the example 2, and the comparative example 1, the change in brightness is within 20%, while in the comparative example 2, the change in brightness reaches 40%. The result in the comparative example 2 is considered to be attributable to a fact that the sub-pixels SPs with different colors are arranged in the Y direction.

As illustrated in FIG. 22, in viewing angle characteristics of the color deviation in the X direction, in each of the example 1, the example 2, the comparative example 1, and the comparative example 2, the change in color deviation is within 0.02 in a viewing angle range of ±20 degrees. Even when the viewing angle is changed in a plus direction or a minus direction, the change in color deviation has the same pattern. On the other hand, in the example 1, the example 2, and the comparative example 1, the change amount is within 0.01, whereas in the comparative example 2, the change amount is large. The result is considered to be attributable to a fact that, in the comparative example 2 as compared with the example 1, the example 2, and the comparative example 1, the sub-pixels SPs with the same color included in the pixel P1 and the pixel P2 adjacent to each other in the X direction are arranged in the X direction, and that, in the resonance structure, the optical distance in optical resonance increases as the viewing angle decreases and thus the wavelength of the light emitted obliquely from the organic EL element 50 is shifted to a long wavelength side, thereby easily occurring the color deviation.

On the other hand, in viewing angle characteristics of the color deviation in the Y direction, as illustrated in FIG. 23, in the example 1 and the example 2, the change in color deviation is within 0.015 in a viewing angle range of ±15 degrees. Even when the viewing angle is changed in a plus direction or a minus direction, the change in color deviation has the same pattern. On the other hand, in the comparative example 1 and the comparative example 2, the change in color deviation is within 0.02 in a viewing angle range of ±15 degrees, whereas the color deviation change amount in a minus viewing angle range is much greater than the color deviation change amount in a plus viewing angle range. The result is considered to be attributable to a fact that, in the comparative example 1 and the comparative example 2 as compared with the example 1 and the example 2, the light emitting regions of the sub-pixels SPs with different colors in the Y direction are not disposed at an equal interval. In particular, in the comparative example 1, since the length of the distance d6 at which the pixel contact regions CH19, CH20, and CH21 are provided is 1.25 µm and the length of the distance d8 at which the pixel contact regions CH19, CH20, and CH21 are not provided is 0.7 µM, the length of the distance d6 and the length of the distance d8 in the Y direction are clearly different from each other.

In the example 1 and the example 2, since the light emitting regions of the sub-pixels SPs with different colors are disposed in the X direction and the Y direction at an equal interval, the color mixing state of the sub-pixels SPs with different colors that are disposed adjacent to each other, is unlikely to change depending on the viewing angle. That is, the color deviation which is caused by the viewing angle is reduced.

Figure 24:
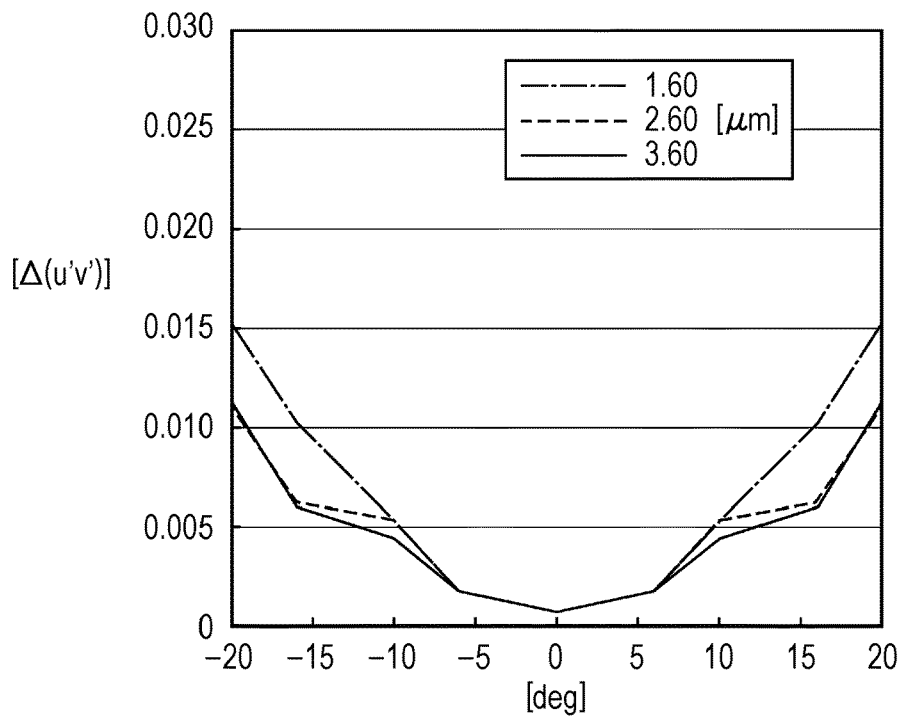
FIG. 24 is a graph illustrating a relationship between a distance from a light emitting portion to a colored layer in an organic EL element and the color deviation.

FIG. 24 is a graph illustrating a relationship between a distance from the light emitting portion to the colored layer in the organic EL element and the color deviation. Specifically, in the example 1, a distance df (refer to FIG. 13) from the light emitting portion to the colored layer 71 in the organic EL element 50, that is, the film thickness of the sealing layer 60 (refer to FIGS. 4 and 5) is 2.6 µm. The viewing angle characteristics of the color deviation in the X direction when the film thickness of the sealing layer 60 is set to 1.6 µm and 3.6 µm, are obtained by optical simulation. As illustrated in FIG. 24, when the distance between the light emitting portion and the colored layer 71 in the organic EL element 50 is shortened, the optical distance of the resonance structure becomes longer at a small viewing angle. Therefore, it is considered that the wavelength of the light emitted obliquely is shifted to a longer wavelength side and thus a degree of the color deviation increases. This relates to the spectral characteristics of light emission in the resonance structure of each sub-pixel SP and the spectral characteristics of the colored layer. Thus, it is preferable to set the distance between the light emitting portion and the colored layer 71 in the organic EL element 50 according to an allowable range of the color deviation. In addition, the film thickness of the sealing layer 60 is related to reliability and quality, and thus it is also necessary to consider the film thickness of the sealing layer 60.

Figure 25:
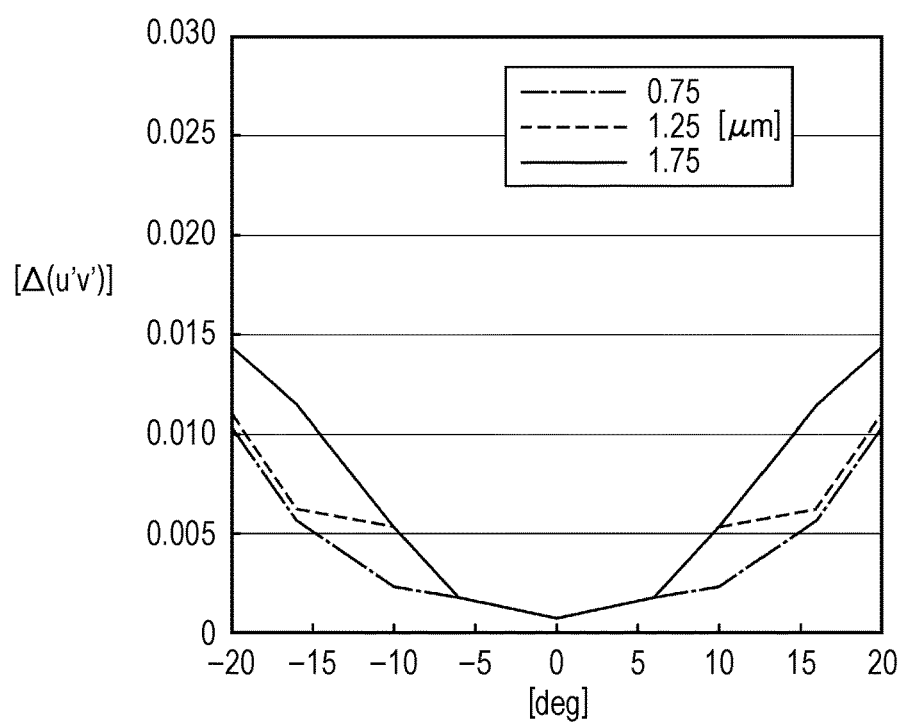
FIG. 25 is a graph illustrating a relationship between widths of the pixel contact regions and the color deviation.

FIG. 25 is a graph illustrating a relationship between widths of the pixel contact regions and the color deviation. Specifically, in the example 1, the distance d5, which is a length of the pixel contact region in the X direction, is 1.25 μm. The viewing angle characteristics of the color deviation in the X direction when the distance d5 is set to 0.75 μm and 1.75 μm, are obtained by optical simulation. As illustrated in FIG. 25, when the length of the distance d5 of the pixel contact region is shortened, the degree of the color deviation is slightly improved. This result is considered to be attributable to a fact that, the length of the sub-pixel 110G or the sub-pixel 110R in the X direction is increased by shortening the length of the distance d5 of the pixel contact region, and thus an area of the light emitting region is substantially increased, thereby relatively changing the color deviation. That is, the result shows that the area of the light emitting region of the sub-pixel SP with respect to the area of the pixel P, that is, an aperture ratio, is related to the color deviation. Therefore, it is preferable to set the size of the pixel contact region according to the aperture ratio of the sub-pixel SP.

Sixth Embodiment

Electronic Apparatus

Figure 26:
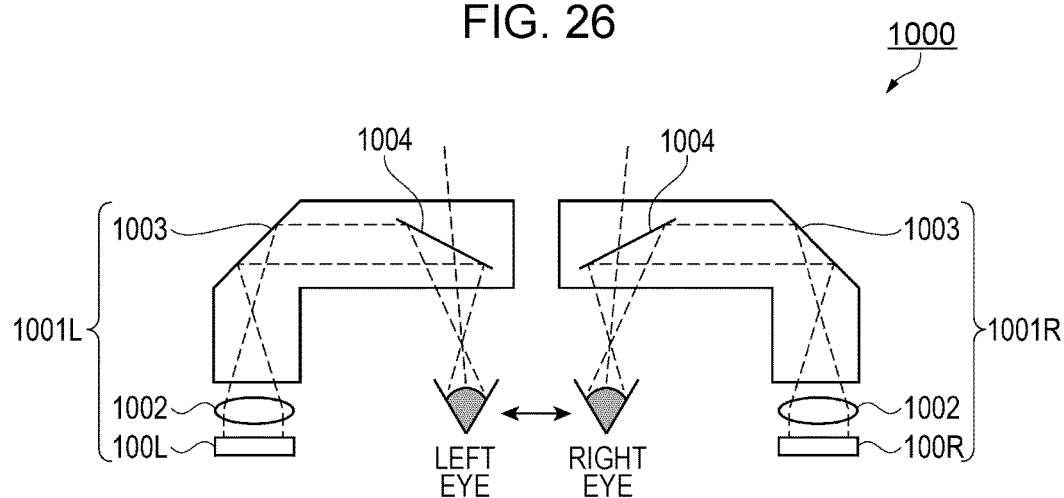
FIG. 26 is a schematic diagram illustrating a configuration of a head mount display as an electronic apparatus.

Next, an example of an electronic apparatus to which the electrooptical device according to the embodiment is applied will be described with reference to FIG. 26. FIG. 26 is a schematic diagram illustrating a configuration of a head mount display as an electronic apparatus.

As illustrated in FIG. 26, a head mount display (HMD) 1000 as an electronic apparatus according to the present embodiment includes a pair of optical units 1001L and 1001R for displaying information corresponding to left and right eyes, a mounting unit (not illustrated) for mounting the pair of optical units 1001L and 1001R on a head of a user, a power supply unit and a control unit (not illustrated), and the like. Here, since the pair of optical units 1001L and 1001R have a symmetrical configuration, the optical unit 1001R for the right eye will be described as an example.

The optical unit 1001R includes a display unit 100R to which the electrooptical device 100 according to the embodiment is applied, a condensing optical system 1002, and a light guide 1003 that is bent in an L shape. The light guide 1003 is provided with a half mirror layer 1004. In the optical unit 1001R, display light emitted from the display unit 100R is incident on the light guide 1003 by the condensing optical system 1002, is reflected by the half mirror layer 1004, and guided to the right eye. The display light (image) projected on the half mirror layer 1004 is a virtual image. Therefore, the user can visually recognize both of the display light (virtual image) by the display unit 100R and the external world in front of the half mirror layer 1004. That is, the HMD 1000 is a transmission type (see-through type) projection display apparatus.

The light guide 1003 is configured by a combination of rod lenses, and forms a rod integrator. The condensing optical system 1002 and the display unit 100R are disposed on the light incident side of the light guide 1003, and the display light condensed by the condensing optical system 1002 is received by the rod lenses. In addition, the half mirror layer 1004 of the light guide 1003 has an angle such that light flux transmitted by the rod lenses is reflected toward the right eye, the light flux being condensed by the condensing optical system 1002, being totally reflected and transmitted by the rod lenses, and being reflected toward the right eye.

The display unit 100R can display a display signal transmitted from the control unit, as image information such as characters and images. The displayed image information is converted from a real image to a virtual image by the condensing optical system 1002.

As described above, the optical unit 1001L for the left eye also includes the display unit 100L to which the electrooptical device 100 according to the embodiment is applied, and the configuration and the function of the optical unit 1001L are the same as those of the optical unit 1001R for the right eye.

According to the present embodiment, the electrooptical device 100 according to the embodiment is applied as the display units 100L and 100R, and thus it is possible to provide a see-through type HMD 1000 capable of reducing the color deviation which is caused by the viewing angle and performing color display with excellent visibility.

In particular, when confirming the projected display light (image) by both eyes, since a distance between the left eye and the right eye of the user is not necessarily constant, a viewing angle range for confirming the display light by the left eye and a viewing angle range for confirming the display light by the right eye may be different from each other depending on the user. On the other hand, when color mixing states in the display unit 100L and the display unit 100R become different from each other due to the viewing angle, the user feels discomfort due to the color deviation in the display light (image) recognized by both eyes, and thus the user gets tired easily when using the head mounted display for longer periods of time. According to the present embodiment, the color deviation which is caused by the viewing angle can be reduced, and thus it is possible to provide the head mounted display 1000 with little fatigue in image recognition even when using the head mounted display for longer periods of time.

The HMD 1000 to which the electrooptical device 100 according to the embodiment is applied is not limited to the configuration including the pair of optical units 1001L and 1001R corresponding to both eyes, and may be configured to include, for example, one optical unit 1001R. In addition, the head mount display is not limited to a see-through type head mount display, and may be an immersing type head mount display with which display can be visually recognized in a state where external light is blocked. In addition, the electrooptical device according to the other embodiments may be applied to the display units 100L and 100R.

The invention is not limited to the embodiments, and can be appropriately changed without departing from the scope or spirit of the inventions that can be read from the claims and the entire specification. An electrooptical device according to modification and an electronic apparatus to which the electrooptical device is applied are also included in a technical scope of the invention. Various modifications other than the embodiments can be considered. Hereinafter, modification examples will be described.

Modification Example 1

In the first embodiment and the third embodiment, in the pixel P, although the sub-pixel 110G and the sub-pixel 110R are disposed below the sub-pixel 110B in the Y direction, the invention is not limited thereto. The sub-pixel 110G and the sub-pixel 110R may be disposed above the sub-pixel 110B in the Y direction. In addition, the sub-pixel 110R may be disposed at a left side of the sub-pixel 110B in the X direction and the sub-pixel 110G may be disposed at a right side of the sub-pixel 110B in the X direction. Further, although the light emitting areas of the sub-pixels 110G and the sub-pixels 110R arranged in the X direction are set to be the same, the invention is not limited thereto. The light emitting areas of the sub-pixels 110G and the sub-pixels 110R may be different from each other. That is, the sub-pixels SPs adjacent to each other are disposed at least in the first direction at an equal interval, and the light emitting area and the arrangement of each sub-pixel SP can be set in consideration of the optical characteristics (spectral characteristics) in the sub-pixels SPs with different colors and the optical characteristics as the display panel 101 (for example, brightness or white balance).

Figure 27:
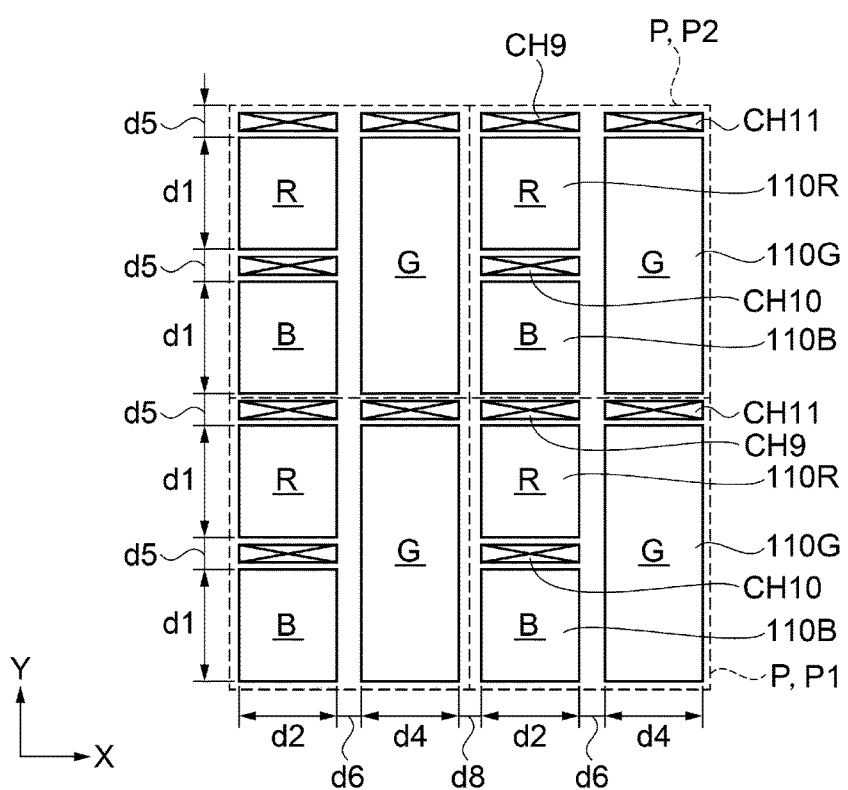
FIG. 27 is a schematic plan view illustrating an arrangement of the sub-pixels and the pixel contact regions in the pixel according to a modification example.

In each embodiment described above, although the row direction (X direction) in the arrangement of the pixels P is described as the first direction of the invention, the invention is not limited thereto. FIG. 27 is a schematic plan view illustrating an arrangement of the sub-pixels and the pixel contact regions in the pixel according to a modification example. For example, as illustrated in FIG. 27, the first direction of the invention may be the column direction (Y direction) in the arrangement of the pixels P, and the second direction intersecting with the first direction may be the row direction (X direction) in the arrangement of the pixels P. The pixel P1 includes the sub-pixel 110B as the first sub-pixel, the pixel contact region CH10 as the first region, the sub-pixel 110R as the second sub-pixel, and the pixel contact region CH9 as the second region that are arranged in the Y direction. The pixel P2, which is adjacent to the pixel P1 in the Y direction, includes the sub-pixel 110B as the third sub-pixel, the pixel contact region CH10 as the third region, the sub-pixel 110R as the fourth sub-pixel, and the pixel contact region CH9 as the fourth region that are arranged in the Y direction.

In addition, the pixel P1 includes the sub-pixel 110G as the fifth sub-pixel and the pixel contact region CH11 as the fifth region that are arranged in the Y direction. In the pixel P1, the sub-pixel 110G is arranged in the X direction intersecting with the Y direction with respect to the sub-pixel 110B and the sub-pixel 110R. The pixel P2, which is adjacent to the pixel P1 in the Y direction, includes the sub-pixel 110G as the sixth sub-pixel and the pixel contact region CH11 as the sixth region that are arranged in the Y direction. Similar to the pixel P1, in the pixel P2, the sub-pixel 110G is arranged in the X direction intersecting with the Y direction with respect to the sub-pixel 110B and the sub-pixel 110R.

The light emitting regions of the sub-pixel 110B and the sub-pixel 110R have a width d1 in the Y direction, and the length in the Y direction between the pixel contact regions CH9 and CH10, that is, the distance between the light emitting regions adjacent to each other in the Y direction is d5. The length of the light emitting region of the sub-pixel 110G in the Y direction is approximately twice the width d1 of the light emitting region of the sub-pixel 110B. The light emitting regions of the sub-pixel 110B and the sub-pixel 110R have a width d2 in the X direction, the light emitting region of the sub-pixel 110G has a width d4 in the X direction, and the width d2 and the width d4 are the same. The length in the X direction between the light emitting regions of the sub-pixel 110B and the sub-pixel 110G in the pixel P is a distance d6, and in the pixels P adjacent to each other in the X direction, the length in the X direction between the light emitting regions of the sub-pixel 110G and the sub-pixel 110B is a distance d8. The distance d6 and the distance d8 are the same. That is, the arrangement of the sub-pixels according to the modification example is obtained by rotating the arrangement of the sub-pixels according to the first embodiment illustrated in FIG. 11 by 90 degrees in a plane, and is made such that the area of the light emitting region of the sub-pixel 110G is larger than the area of the light emitting region of the sub pixel 110B by replacing the sub-pixel 110B and the sub-pixel 110G. Thereby, a balance in light emission brightness and a lifetime of the organic EL element 50 of the sub-pixel SP in the pixel P can be adjusted. Even with the arrangement of the sub-pixels SP with different colors in the pixel according to the modified example, it is possible to reduce the color deviation which is caused by the viewing angle in the row direction (X direction) and the column direction (Y direction).

Modification Example 2

In each of the embodiments, although desired color light is obtained from the sub-pixels SPs with different colors by combination of the organic EL element 50 capable of emitting white light and the resonance structure, the resonance structure is not necessarily provided. For example, the invention can also be applied to a configuration in which the resonance structure is not included or a configuration in which an organic EL element capable of obtaining color light corresponding to each of the sub-pixels SPs with different colors is provided.

Modification Example 3

The arrangement of the sub-pixels SPs with different colors and the pixel contact regions according to the invention is not limited to application to the self-emission type electrooptical device 100. For example, the invention can also be applied to a light receiving type display device using illumination light, such as a transmission type liquid crystal device.

Modification Example 4

The electronic apparatus to which the electrooptical device according to each embodiment can be applied is not limited to the head mount display 1000 according to the sixth embodiment. For example, the invention can be applied to various types of projection type display devices such as a head-up display (HUD) for a vehicle or an illumination type display device.

The entire disclosure of Japanese Patent Application No. 2017-016529, filed Feb. 1, 2017, and 2017-218018, filed Nov. 13, 2017 are expressly incorporated by reference herein.

What is claimed is:
1. An electrooptical device comprising:
a first pixel including a first sub-pixel, a first region, a second sub-pixel and a second region, which are arranged in a first direction in an order of the first sub-pixel, the first region, the second sub-pixel and the second region; and
a second pixel, different from the first pixel, including a third sub-pixel, a third region, a fourth sub-pixel and a fourth region, which are arranged in the first direction in an order of the third sub-pixel, the third region, the fourth sub-pixel and the fourth region, wherein:
the first sub-pixel and the second sub-pixel have different colors from each other;

the third sub-pixel and the fourth sub-pixel have different colors from each other;

the first region is a pixel contact region of the first sub-pixel;

the second region is a pixel contact region of the second sub-pixel;

the third region is a pixel contact region of the third sub-pixel;

the fourth region is a pixel contact region of the fourth sub-pixel;

the first region, the second region, the third region, and the fourth region have a same length in the first direction; and the first pixel includes a fifth sub-pixel having a length different from lengths of the first and second sub-pixels in the first direction.

2. The electrooptical device according to claim 1, wherein:

the first pixel includes the fifth sub-pixel and a fifth region, which are arranged in the first direction, the fifth sub-pixel being arranged in a second direction intersecting with the first direction with respect to the first sub-pixel and the second sub-pixel;

the second pixel includes a sixth sub-pixel and a sixth region, which are arranged in the first direction, the sixth sub-pixel being arranged in the second direction with respect to the third sub-pixel and the fourth sub-pixel;

the fifth region is a pixel contact region of the fifth sub-pixel;

the sixth region is a pixel contact region of the sixth sub-pixel; and the fifth region and the sixth region have a same length in the first direction.

3. The electrooptical device according to claim 2, wherein:

the first pixel includes a seventh region between (i) the first and second sub-pixels and (ii) the fifth sub-pixel in the second direction;

the second pixel includes an eighth region between (i) the third and fourth sub-pixels and (ii) the sixth sub-pixel in the second direction; and the seventh region and the eighth region have a same length in the second direction.

4. An electronic apparatus comprising:
the electrooptical device according to claim 3.

5. The electrooptical device according to claim 2, wherein:

an area of the fifth sub-pixel and an area of the sixth sub-pixel are larger than each area of the first sub-pixel, the second sub-pixel, the third sub-pixel, and the fourth sub-pixel; and the fifth sub-pixel and the sixth sub-pixel have a blue color.

6. An electronic apparatus comprising:
the electrooptical device according to claim 2.

7. The electrooptical device according to claim 1, wherein the third sub-pixel, the third region, the fourth sub-pixel, and the fourth region are disposed along the first direction to be parallel to the first sub-pixel, the first region, the second sub-pixel, and the second region that are disposed in the first direction.

8. An electronic apparatus comprising:
the electrooptical device according to claim 7.

9. The electrooptical device according to claim 1, wherein among the first, second, third and fourth sub-pixels, the first sub-pixel and the third sub-pixel have a same color, and other sub-pixels have colors different from the color of the first sub-pixel and the third sub-pixel.

10. The electrooptical device according to claim 1, wherein among the first, second, third and fourth sub-pixels, the second sub-pixel and the third sub-pixel have a same color, and other sub-pixels have colors different from the color of the second sub-pixel and the third sub-pixel.

11. The electrooptical device according to claim 1, wherein:

each of the first sub-pixel, the second sub-pixel, the third sub-pixel, and the fourth sub-pixel includes a light emitting element and a colored layer that converts light from the light emitting element into light in a predetermined wavelength range; and each respective pixel contact region of the first sub-pixel, the second sub-pixel, the third sub-pixel, and the fourth sub-pixel is a non-light-emitting region.

12. The electrooptical device according to claim 11, wherein the light emitting element and the colored layer are provided on a same substrate.

13. An electronic apparatus comprising:
the electrooptical device according to claim 1.

14. A head mount display comprising:
the electrooptical device according to claim 1,
the electrooptical device being configured such that a displayed image is recognized by at least one eye of both eyes.

15. An electrooptical device comprising:

a first sub-pixel, a first region, a second sub-pixel, a second region, a third sub-pixel, a third region, a fourth sub-pixel, a fourth region, which are arranged in a first direction, the first, second, third and fourth regions not including a contact region for a sub-pixel;

a fifth sub-pixel, and a sixth sub-pixel, each of the fifth sub-pixel and the sixth sub-pixel having a length different from lengths of the first, second, third and fourth sub-pixels in the first direction;

a fifth region including pixel contact regions of the first sub-pixel and the second sub-pixel;

a sixth region which is a pixel contact region of the fifth sub-pixel;

a seventh region including pixel contact regions of the third sub-pixel and the fourth sub-pixel; and an eighth region which is a pixel contact region of the sixth sub-pixel, wherein:

(i) the fifth region, (ii) the first sub-pixel and the second sub-pixel, (iii) the sixth region, and (iv) the fifth sub-pixel are arranged in an order from (i), (ii), (iii) to (iv) in a second direction intersecting with the first direction;

(v) the seventh region, (vi) the third sub-pixel and the fourth sub-pixel, (vii) the eighth region, and (viii) the sixth sub-pixel are arranged in an order from (v), (vi), (vii) to (viii) in the second direction;

the first sub-pixel and the second sub-pixel have different colors from each other;

the third sub-pixel and the fourth sub-pixel have different colors from each other;

the fifth region, the sixth region, the seventh region, and the eighth region have a same length in the second direction; and the first region, the second region, the third region, the fourth region, the fifth region, the sixth region, the seventh region and the eighth region are all distinct from each other.

16. The electrooptical device according to claim 15, wherein
lengths of the first region, the second region, the third region, and the fourth region in the first direction are same as a length of a ninth region in the first direction, the ninth region being a region between the fifth sub-pixel and the sixth sub-pixel in the first direction.

17. An electrooptical device comprising:
a plurality of display units that are arranged in a first direction and a second direction intersecting with the first direction; and
each display unit including at least a first sub-pixel, a second sub-pixel and a third sub-pixel with different colors, a length of the third sub-pixel being different from lengths of the first sub-pixel and the second sub-pixel in the first direction, the third sub-pixel being arranged in the second direction with respect to the first and second sub-pixels while the first and second sub-pixels are arranged in the first direction, wherein:
in different display units adjacent in the first direction, each respective first region of the different display units between the first sub-pixel and the second sub-pixel has a same length in the first direction; and
the first region is a pixel contact region of one of the first sub-pixel and the second sub-pixel.

18. The electrooptical device according to claim 17, wherein:
for the different display units adjacent in the first direction, a length of each respective first region in the first direction is same as a length of a second region between the third sub-pixels in the different display units adjacent in the first direction; and
the second region is a pixel contact region of the third sub-pixel of one of the different display units.

19. The electrooptical device according to claim 18, wherein:
in two display units adjacent in the second direction, each respective third region of the two display units between (i) the first and second sub-pixels and (ii) the third sub-pixel has a same length in the second direction.

20. An electrooptical device comprising:
a plurality of display units that are arranged in a first direction and a second direction intersecting with the first direction; and
each respective display unit including a first sub-pixel, a second sub-pixel, and a third sub-pixel with different colors, the first sub-pixel and the second sub-pixel being arranged in the first direction, and the third sub-pixel being arranged in the second direction with respect to the first sub-pixel and the second sub-pixel, wherein:
in different display units adjacent in the first direction, a length of each respective first region of the different display units between the first sub-pixel and the second sub-pixel in the first direction is same as a length of a second region between the third sub-pixels in the different display units adjacent in the first direction;
in two display units adjacent in the second direction, each respective third region of the two display units between (i) the first and second sub-pixels and (ii) the third sub-pixel has a same length in the second direction; and
each respective third region is a pixel contact region of one of the first sub-pixel, the second sub-pixel, and the third sub-pixel in each of the two display units.

* * * * *